(12) United States Patent
Nagayasu et al.

(10) Patent No.: US 6,269,124 B1
(45) Date of Patent: Jul. 31, 2001

(54) DATA TRANSMISSION SYSTEM, RECEIVER, AND RECORDING MEDIUM

(75) Inventors: Takayuki Nagayasu; Keishi Murakami, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/087,926

(22) Filed: Jun. 1, 1998

(30) Foreign Application Priority Data

Jun. 26, 1997 (JP) .................................................. 9-170775

(51) Int. Cl.[7] .................................................. H04L 23/02
(52) U.S. Cl. .......................... 375/262; 375/259; 375/341; 714/746; 714/294; 714/295
(58) Field of Search .................................... 375/265, 259, 375/262, 263, 341; 714/746, 701, 716, 750, 752, 754, 759, 761, 774, 786, 794, 797, 796, 795; 341/143

(56) References Cited

U.S. PATENT DOCUMENTS

| 5,757,865 | * | 5/1998 | Kaku et al. | 375/344 |
| 6,034,998 | * | 3/2000 | Takashi et al. | 375/294 |

FOREIGN PATENT DOCUMENTS

| 0689312A2 | 12/1995 | (EP) . |
| 0731567A2 | 9/1996 | (EP) . |
| WO97 14235 | 4/1997 | (WO) . |

OTHER PUBLICATIONS

"Digital Communications," John G. Proakis, Second Edition, McGraw–Hill, 1989, pp. 440.

"Maximum–Liklihood Sequence Estimation of Digital Sequences in the Presence of Intersymbol Interference," G.D. Forney Jr., IEEE Transactions on Information Theory, vol. IT–18 pp. 363–378, May 1972.

"Optimum and Sub–Optimum Detection of Coded data Disturbed by Time–Varying Intersymbol Interference," W. Koch, IEEE GLOBECOM '90, San Diego, pp. 1679–1685, Dec. 1990.

"A MLSE receiver for the GSM digital cellular system," Shigeru Ono et al., IEEE 44th, VTC, Stockholm, pp. 230–233, Jun. 1994.

The Turbo Principle: Tutorial Introduction and State of the Art, Joachim Hagenauer, Sep. 1997, pp. 1–11.

Turbo Equalization Over A Frequency Selective Channel, A. Glavieux, et al. Sep. 1997. pp. 96–102.

* cited by examiner

*Primary Examiner*—Chi Pham
*Assistant Examiner*—Bayard Emmanuel

(57) ABSTRACT

A data transmission system, a receiver, and a recording medium in which a re-coder (16) generates pseudo transmission signals based on the virtual received data after a decoder (15) generates virtual received data based on virtual decision data from a virtual decision circuit (12), and a soft-decision circuit (18) outputs soft-decision data so as to decrease the number of different bits between the pseudo transmission signals and the received signals, and the received data are generated based on the soft-decision data.

11 Claims, 15 Drawing Sheets

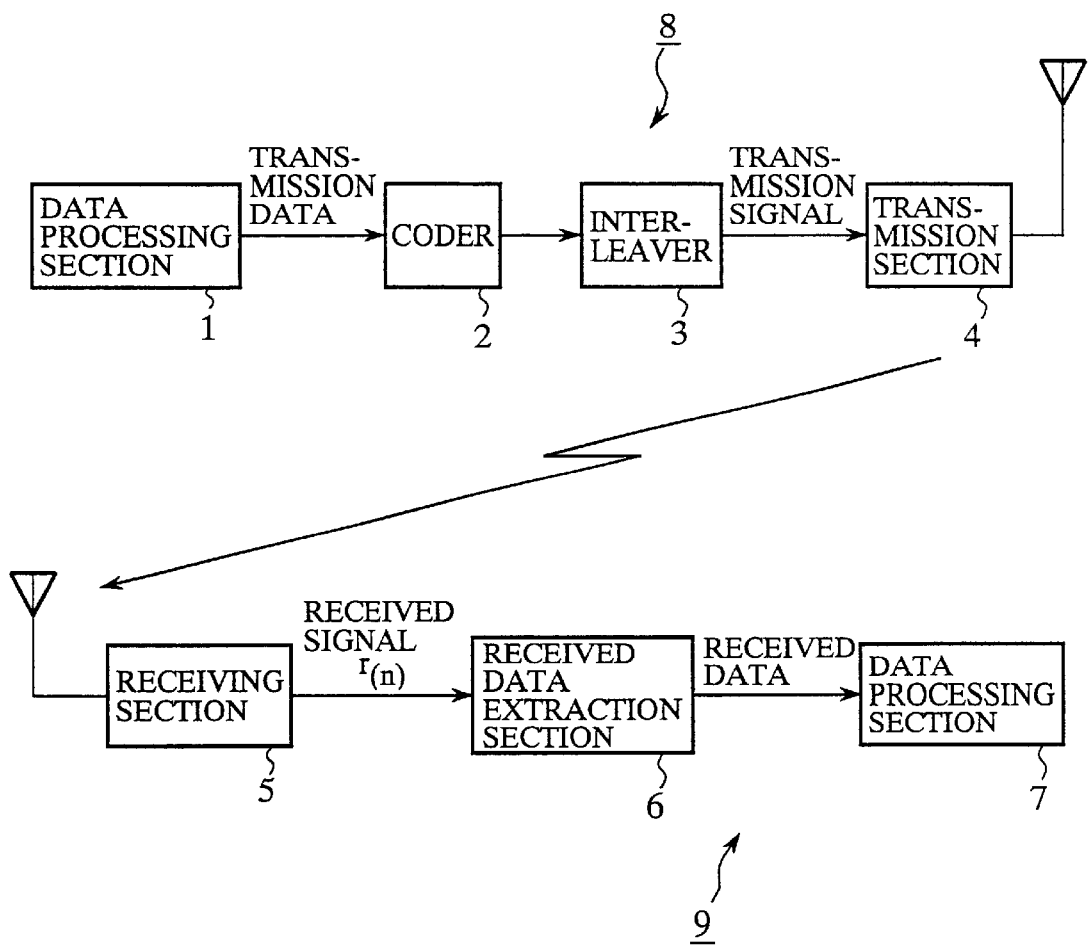
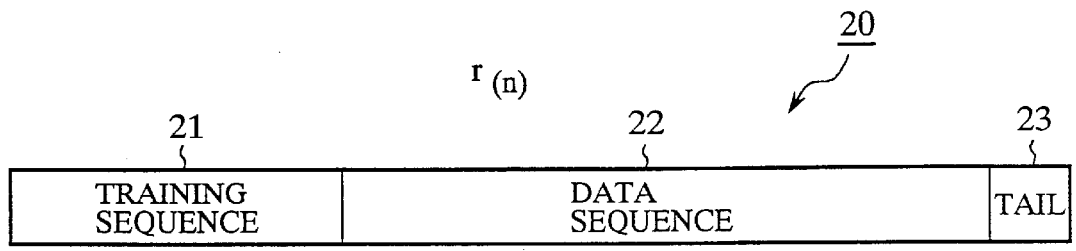

FIG.9A (a) m=0 
FIG.9B (b) m=0 
FIG.9C (c) m=0 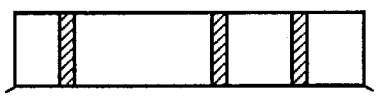
FIG.9D (f) m=0 
FIG.9E (d) m=0 
FIG.9F (a) m=1 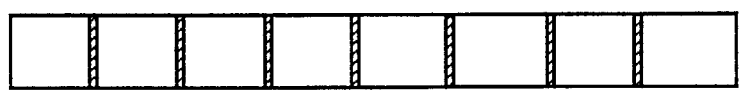
FIG.9G (b) m=1 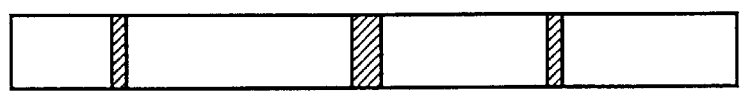
FIG.9H (c) m=1 

DATA TRANSMISSION SYSTEM, RECEIVER, AND RECORDING MEDIUM

BACKGROUND OF THE INVENTION

1. Field of the Invention

The present invention relates to a data transmission system, a receiver, and a recording medium for use in data transmission and data reception applications for various kinds of data such as characters, image data and so on, and, more particularly, to a data transmission system, a data receiver, and a recording medium, that are capable of improving a data error rate of the data transmission, for use in data transmission using radio transmission channels or paths such as automobile telephones and the like.

2. Description of the Prior Art

FIG. 18 is a block diagram showing a configuration of a received data extraction section in a conventional receiver that has been disclosed in the literature "Digital communication", John G. Proakis, Second edition, McGraw-Hill, 1989. In FIG. 18, the reference number 201 designates a modulator for performing decision of received signal and for outputting a hard-decision value or a soft-decision value. The reference number 202 denotes a deinterleaver for alining outputs from the demodulator 201 into an original data sequence. The reference number 203 indicates a decoder for decoding coded data outputted from the deinterleaver 202. The received data extraction section described above receives the transmission signals through radio transmission channels or paths, an antenna, a band filter, and an A/D converter, for example.

The conventional receiver including the received data extraction section having the above configuration is combined with a transmitter having a transmission signal generator shown in FIG. 19 so as to form a data transmission system. In FIG. 19, the reference number 211 designates a coder for coding the transmission data, 212 denotes an interleaver for arranging the coded data outputted from the coder 211, and 213 indicates a modulator for generating transmission signals that have been modulated by using the arranged data.

Next, a description will be given of the operation of the conventional data transmission system.

In the transmitter, the coder 211 performs coding of the transmission data, the interleaver 212 arranges the coded data sequence, and the modulator 213 modulates the arranged data sequence and transmits the modulated data as transmission signals.

On the other hand, in the receiver, the demodulator 201 performs decision processing for the received signals and outputs a hard-decision data or a soft-decision data as a decision result, the deinterleaver 202 arranges the output from the demodulator 201 into the original data sequence, the decoder 203 decodes the coded data outputted from the deinterleaver 202 and then outputs the received data.

The above coding processing is a redundancy processing for data so as to perform error correction processing to be executed by the receiver side.

The hard-decision processing is a processing to perform the decision processing of the kind of the transmitted data, and to output transmission data sequence after the hard-decision processing as the hard-decision data. Therefore when the transmission data sequence are made up of two-value signals such as 1 and −1, the data sequence formed by the combination of the two-value signals 1 and −1 are outputted as the hard-decision data.

On the other hand, the soft-decision processing is a processing to perform a decision of a reliability data of the hard-decision processing with the hard-decision data. Therefore when the transmission data sequence are made up of the two-value signals such as 1 and −1, various data items such as +30 (data +1 has a higher reliability), +0.9 (data +1 has a lower reliability), −0.4 (data −1 has a lower reliability), and −50 (data −1 has a higher reliability) are outputted.

In the above example, a code or sign of the soft-decision value represents the hard-decision value in which the hard-decision value becomes 1 when the sign is Plus "+", and the hard-decision value becomes −1 when the sign is Minus "−", and the absolute value of the soft-decision value represents the reliability. In this case, when the magnitude of the absolute value is larger, the reliability is increased. In general, it is generally known that utilization of the soft-decision processing has a lower error rate at the output of the decoder than utilization of the hard-decision processing.

A maximum-likelihood sequence estimator of digital sequence and soft-decision output equalizer may be used as the above demodulator 201. This maximum-likelihood sequence estimator of digital sequence has been disclosed in the literature "Maxmum-likelihood sequence estimation of digital sequence in presence of intersymbol interference", G. D. Forney, Jr., IEEE Trans. Information Theory, vol.IT-18, pp.363–378, May 1972. The soft-decision output equalizer have been written in the literature "Optimum and sub-optimum detection of coded data disturbed by time-varying intersymbol interference", W.Koch, IEEE GLOBECOM '90, San Diego, pp.1679–1685, December 1990.

Further, a data demodulation method may also be used as the demodulator 201. This data demodulation method has been disclosed in the literature "A MLSE receiver for the GSM digital cellular system", S. Ono. IEEE 44th, VTC, Stockholm, pp.230–233, June 1994. In the data demodulation method described above, the soft-decision data is calculated and outputted based on the hard-decision data outputted by the maximum-likelihood sequence estimator.

Because the conventional data transmission system has the configuration described above, when it is constructed by using the radio transmission channels or paths for automobile telephones and the like in which burst errors relatively happen, the data error rate becomes higher relatively, so that it causes a drawback that it is difficult to have a better quality.

SUMMARY OF THE INVENTION

Accordingly, an object of the present invention is, with due solution to the drawbacks of the conventional data transmission systems, the conventional receivers, to provide a data transmission system, a receiver, and a recording medium having a lower error rate of received data sequence even if radio wave transmission channels or paths such as automobile telephones are used for data communication.

In accordance with a preferred embodiment of the present invention, a data transmission system comprises a transmitter for outputting transmission signals corresponding to transmission data after the transmission data are generated by coding processing with an error correction, a receiver for receiving wave form of the transmission signals, for extracting virtual received data from the transmission signals by decoding process (error-correction process), for generating pseudo transmission signals based on the virtual received data, and for correcting the virtual received data so that the pseudo transmission signals are approached gradually to the transmission signals transmitted from the transmitter, and for using the corrected virtual received data as the received data.

In accordance with another preferred embodiment of the present invention, a receiver comprises a receiving section for receiving transmission signals corresponding to transmission data that have been processed by a coding processing for the purpose of error correction and transmitted from a transmitter, and for outputting received signals, a virtual received data extraction section for decoding the received signals for the purpose of error correction, and for outputting virtual received data, a pseudo signal generation section for performing calculation processing, that includes the same coding processing performed by the transmitter, for the virtual received data, and for generating pseudo transmission signals, and a virtual received data correction section for correcting the virtual received data based on the pseudo transmission signals, the received signals, and a channel impulse of a transmission channel through which the transmission signals are transmitted, and for using the corrected virtual received data as the received data.

In accordance with another preferred embodiment of the present invention, a receiver comprises a receiving section for receiving transmission signals corresponding to transmission data that have been processed by coding processing for the purpose of error correction and transmitted from a transmitter, and for outputting received signals, virtual decision means for extracting virtual decision data from the received signals based on a channel impulse response through which the transmission signals are transmitted, decoding means for performing decoding processing for the purpose of error correction for the virtual decision data and for generating and outputting virtual received data, recoding means for performing the coding for the virtual received data, a soft-decision means for outputting soft-decision data based on pseudo transmission signals, the received signals, and the channel impulse response, and switching means for providing the soft-decision data instead of the virtual decision data to the decoding means. In the receiver, the soft-decision data are inputted at least one time into the decoding means, and final virtual received data in the virtual received data outputted from the decoding means are outputted as the received data.

In the receiver as another preferred embodiment of the present invention, the virtual decision means comprises a channel impulse response estimation circuit for estimating the channel impulse response based on the received signals, and a virtual decision circuit for extracting the virtual decision data from the received signals based on the estimated channel impulse response.

In the receiver as another preferred embodiment of the present invention, the soft-decision means comprises a channel impulse response updating circuit for updating the channel impulse response based on the pseudo transmission signals, and the received signals, and a soft-decision circuit for generating and outputting soft-decision data based on the updated channel impulse response, the pseudo transmission signals, and the received signals.

In the receiver as another preferred embodiment of the present invention, the decoding means comprises a deinterleave circuit for deinterleaving the virtual decision data, and a decoding circuit for performing decoding processing for the purpose of error correction for the virtual decision data that have been deinterleaved, and the re-coding means comprises a recoding circuit for performing same coding processing performed by the transmitter for the virtual received data outputted from the decoding means, and an interleave circuit for performing same interleave processing performed by the transmitter for the re-coded virtual received data.

In the receiver as another preferred embodiment of the present invention, the re-coding circuit performs a convolutional coding, and the decoding circuit performs a Viterbi decoding.

The receiver as another preferred embodiment of the present invention, further comprises an error number a detection circuit for comparing the decision data inputted to the decoding means with the re-coded data outputted from the re-coding means in order to count an error number as a number of different bits of the decision data and the re-coded data and for outputting the error number, and a loop number control circuit for controlling whether correction processing for the virtual received data is continued or halted based on the error number outputted from the error number detection circuit.

The receiver as another preferred embodiment of the present invention, further comprises an error number detection circuit for comparing the data inputted to the interleave circuit with the data outputted from the deinterleave circuit in order to count an error number as a number of different bits of them and for outputting the error number, and a loop number control circuit for controlling whether correction processing for the virtual received data is continued or hated based on the error number outputted from the error number detection circuit.

In the receiver as another preferred embodiment of the present invention, the receiving section comprising P (P≧1) receiving parts for receiving transmission signals corresponding to transmission data that have been processed by coding processing for the purpose of error correction and transmitted from a transmitter, and for outputting P received signals, the virtual decision means extracts virtual decision data from the P received signals based on P channel impulse response through which the transmission signals are transmitted respectively, the decoding means performs decoding processing for the purpose of error correction for the virtual decision data and for generating and outputting virtual received data, the re-coding means performs the coding processing for the virtual received data, the soft-decision means outputs soft-decision data based on pseudo transmission signals, the P received signals, and the P channel impulse response, the switching means provides the soft-decision data instead of the virtual decision data to the decoding means, and wherein the soft-decision data are inputted at least one time into the decoding means, and final virtual received data in the virtual received data outputted from the decoding means are outputted as the received data.

In accordance with another preferred embodiment of the present invention, a recording medium stores a program that is readable by a computer, and the program performs functions including the step of extracting virtual decision data based on received signals based on a channel impulse response through which the received signals are transmitted, the step of performing decoding processing for the purpose of error correction for the virtual decision data and outputting virtual received data, the step of performing re-cording for the virtual received data, the step of performing a soft-decision for pseudo transmission signals, the received signals and the channel impulse response, and outputting soft-decision data, the step of performing switching processing for inputting the soft-decision data instead of the virtual decision data into the decoding processing, and the step of performing loop number control processing for inputting the soft-decision data one time and outputting final virtual received data in the virtual received data outputted from the decoding processing as the received data.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 1 is a block diagram showing a data transmission system according to the first embodiment of the present invention;

FIG. 2 is a construction of a transmission data showing a data sequence of the transmission signal (received signal r(n)) shown in FIG. 1;

FIGS. 9A to 9H are explanation diagrams showing error correction processing in a data processing loop in the receiver of the first embodiment of the present invention;

DESCRIPTION OF THE PREFERRED EMBODIMENTS

Figure 3:
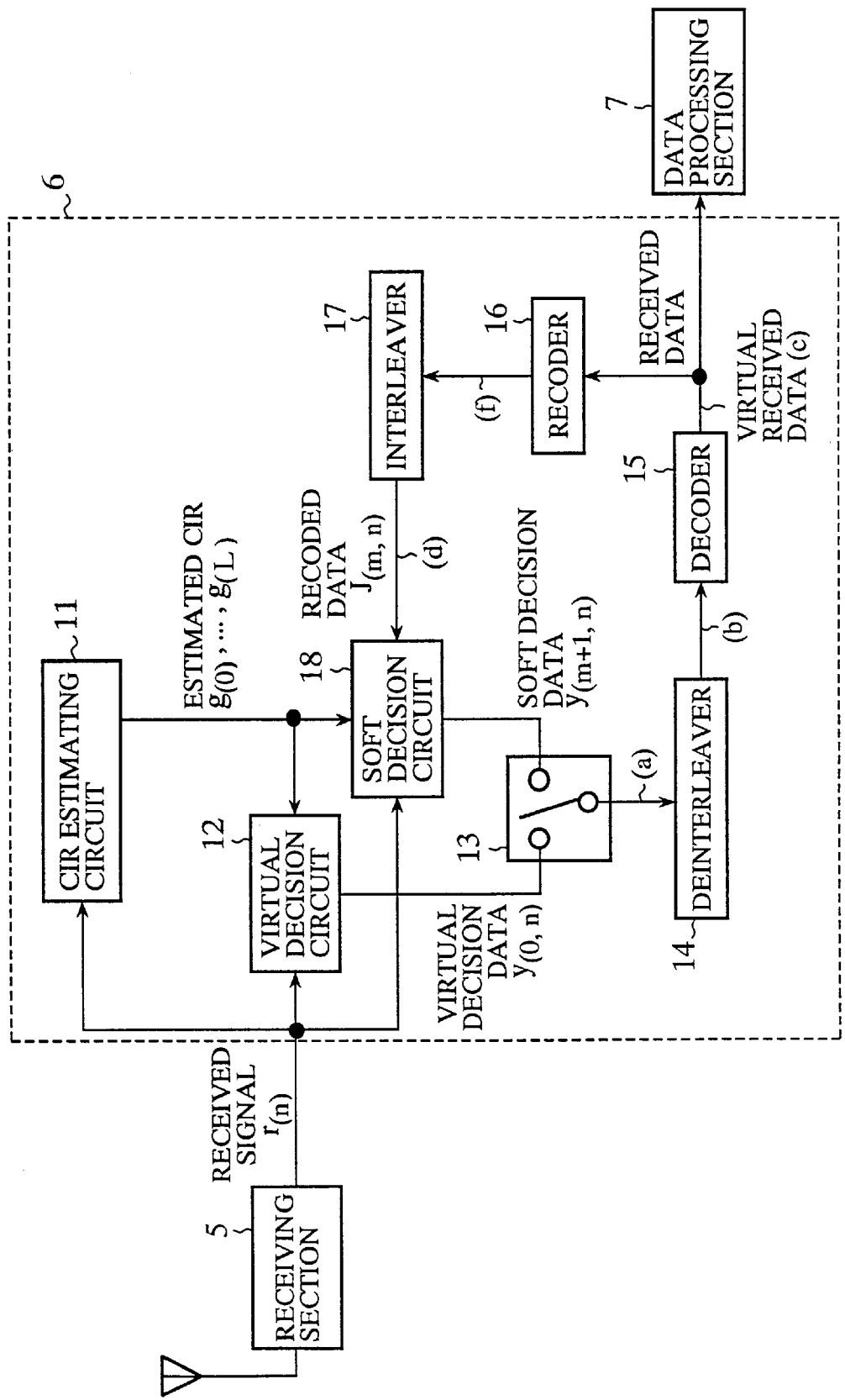
FIG. 3 is a block diagram showing a detailed configuration of a data extractor shown in FIG. 1.

Other features of this invention will become apparent through the following description of preferred embodiments which are given for illustration of the invention and are not intended to be limiting thereof.

Preferred embodiments of a data transmission system, a receiver, and a recording medium according to the present invention will now be described with reference to the drawings.

First Embodiment

FIG. 1 is a block diagram showing the data transmission system according to the first embodiment of the present invention. In FIG. 1, the reference number 1 designates a data processing section in a transmitter for outputting transmission data, 2 denotes a coder in the transmitter for coding the transmission data into coded data sequence including error correction codes. The reference number 3 indicates an interleaver in the transmitter for arranging the coded data sequence and outputting the arranged data sequence as transmission signals. The reference number 4 designates a transmission section for transmitting the transmission signals through radio channels. Thus, the transmitter 8 comprises the data processing section 1, the coder 2, the interleaver 3, and transmission section 4.

The reference number 5 denotes a receiving section for receiving the transmission signals from the transmitter 8 and for outputting received signal sequence r(n). The reference number 6 indicates a received data extraction section for extracting received data sequence R(d) based on the received signal sequence r(n). The reference number 7 designates a data processing section in the receiver for performing desired processing based on the received data sequence R(d). The receiver 9 comprises the receiving section 5, the received data extraction section 6, the data processing section 7. Specifically, the receiving section 5 in the receiver 9 comprising a band filter (not shown), an A/D converter (not shown) and the like. The received signal sequence r(n) are generated by those band filter and the A/D convertor and the like in the receiving section 5.

FIG. 2 is a configuration of the transmission data sequence of the transmission signal transmitted from the transmitter 8 shown in FIG. 1. In FIG. 2, the reference number 21 designates a training sequence to be used when the receiver 9 estimates the channel impulse response. The reference number 22 denotes data sequence that have been obtained by coding the transmission data sequence. The reference number 23 indicates a tail that is added corresponding to an intersymbol interference (ISI). The training sequence 21 and the tail 23 are known data items by the receiver 9. Here, we define that the tail 23 comprises data more than L symbols. This will be used in the following explanation.

FIG. 3 is a block diagram showing a detailed configuration of the data extraction section 6 in the receiver 9 shown in FIG. 1. In FIG. 3, the reference number 11 designates CIR estimator (Channel Impulse Response, hereinafter referred to as a CIR estimator) for estimating channel impulse response (CIR) g(0), . . . , and g(L) based on the training sequence 21 in the received signal sequence r(n) received by the receiver 9. The reference number 12 performs the decision of the data sequence 22 of the received signal sequence r(n) based on the estimated CIR g(0), . . . , and g(L) and for outputting virtual decision data y(0, n). The reference number 14 denotes a deinterleaver for arranging the data sequence of the virtual decision data y(0, n) into original data sequence. The reference number 15 designates a decoder for decoding the deinterleaved virtual decision data and for outputting the decoded data as virtual received data (c). The reference number 16 denotes a re-coder for re-coding the virtual received data (c) by the same manner executed by the coder 2 in the transmitter 8 and for outputting re-coded data (f). The reference number 17 indicates an interleaver for arranging the re-coded data (f) so as to output arranged re-coded data (d) J(0, n). The reference number 18 designates a soft-decision circuit for generating a wave form of a pseudo received signal based on the arranged re-coded data J(0, n) and the estimated CIR g(0), . . . ,g(L), and for estimating an error of the wave form of the pseudo received data corresponding to the received signal r(n), and for outputting a new soft-decision data y(m+1, n) that has been calculated using the estimated error e(m, n).

The reference number 13 denotes a switching circuit forming a data correction loop for outputting the soft decision data y(m+1, n) into the deinterleaver 14 instead of the virtual decision data y(0, n).

Figure 4:
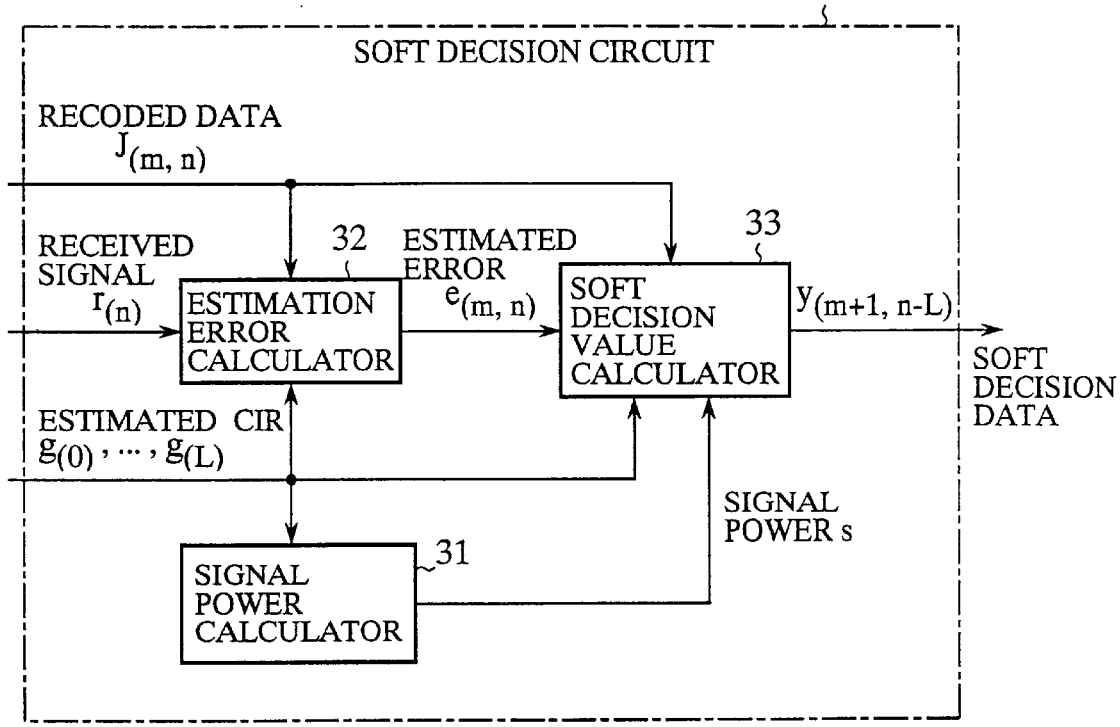
FIG. 4 is a block diagram showing a detailed configuration of a soft-decision circuit shown in FIG. 3.

FIG. 4 is a block diagram showing a detailed configuration of the soft-decision circuit 18 shown in FIG. 3. In FIG. 4, the reference number 32 designates an estimation error calculator for re-generating the wave form of the pseudo received data based on the re-coded data J(m, n) and the estimated CIR g(0), . . . ,g(L), and for outputting an estimation error of the waveform of the pseudo received signal corresponding to the received signal r(n). The reference number 31 denotes a signal power calculator for calculating a signal power s of the received signal sequence r(n). The reference number 33 outputs a soft-decision value calculator for outputting a new soft-decision data y(m+1, n) based on the estimated error e(m, n), the estimated CIR g(0), . . . , g(L), and the re-coded data J(m, n), and the signal power s.

Figure 5:
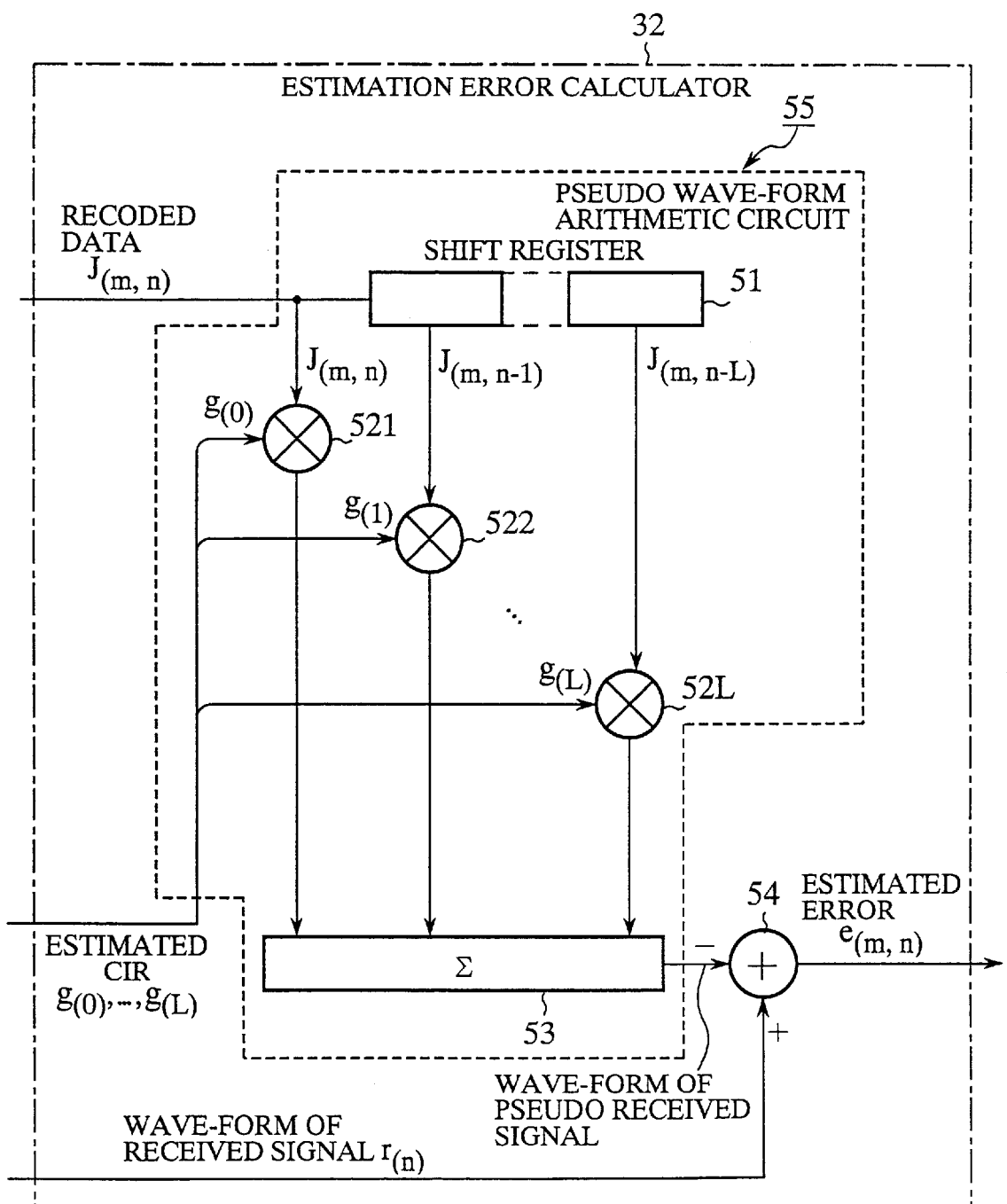
FIG. 5 is a block diagram showing a detailed configuration of an estimation error calculator shown in FIG. 4.

FIG. 5 is a block diagram showing a detailed configuration of the estimation error calculator 32 shown in FIG. 4. In FIG. 5, the reference number 51 designates a shift register for storing the re-coded data J(m, n−1), . . . , J(m, n−L). The reference numbers 521 to 52L indicate multipliers for multiplying each of the re-coded data J(m, n−1), . . . , J(m, n−L) stored in the shift register 51, each inputted re-coded data J(m, n), and each of the estimated CIR g(0), . . . , g(L). The reference number 53 designates a summation circuit ($\Sigma$) for calculating the summation of the (L+1) multiplied values described above. The pseudo wave form calculator 55 comprises the shift register 51, the multipliers 521 to 52L, and the summation circuit 53. Specifically, the output from the summation circuit ($\Sigma$) 53 becomes the pseudo received signal.

The reference number 54 designates subtractor for calculating an error of the pseudo received signal corresponding to the received signal sequence r(n), and for outputting this error as the estimated error e(m, n).

Figure 6:
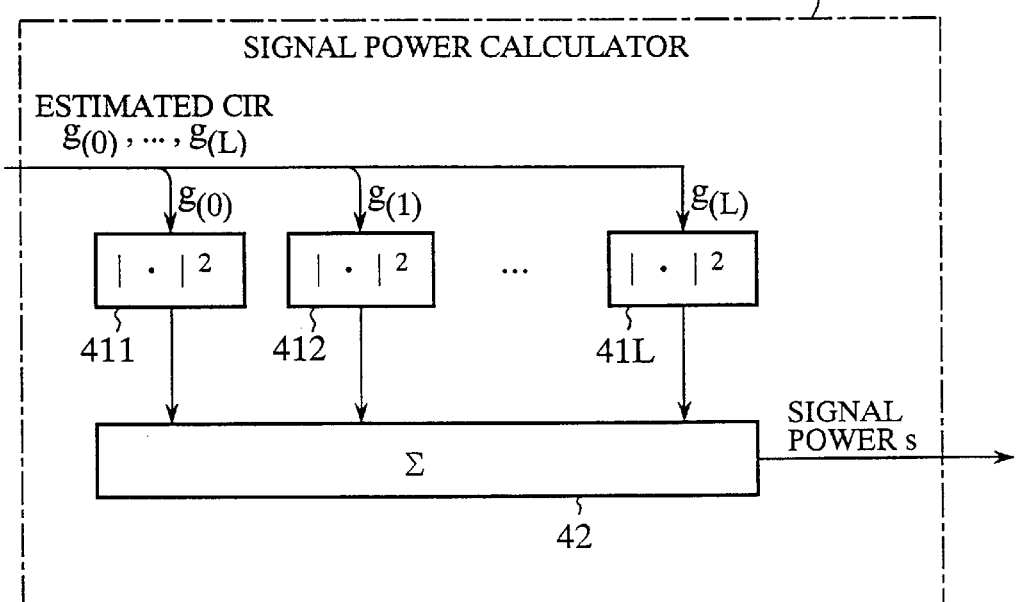
FIG. 6 is a block diagram showing a detailed configuration of a signal power calculator shown in FIG. 4.

FIG. 6 is a block diagram showing a detailed configuration of the signal power calculator 31 shown in FIG. 4. In FIG. 6, each of the reference numbers 411 to 41L denotes a square circuit for calculating a square value of each of the estimated CIR g(0), . . . , g(L). The reference number 42 designates a summation circuit ($\Sigma$) for calculating the summation of the above (L+1) square values and for outputting the summation as the signal power s.

Figure 7:
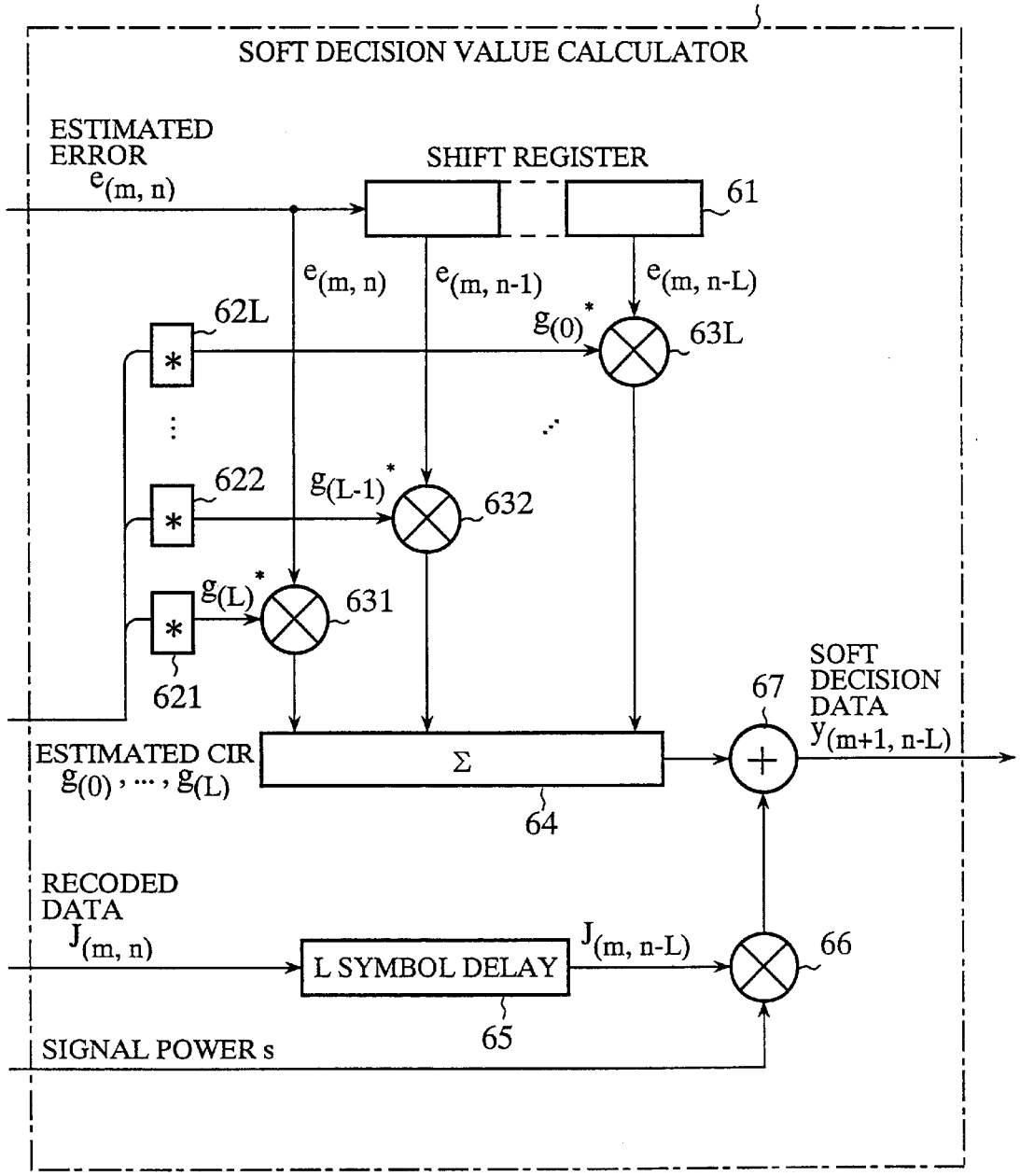
FIG. 7 is a block diagram showing a detailed configuration of a soft-decision value calculator shown in FIG. 4.

FIG. 7 is a block diagram showing a detailed configuration of the soft-decision value calculator 33 shown in FIG. 4. In FIG. 7, the reference number 61 designates a shift register for storing estimated error e(m, n−1), . . . , e(m, n−L). Each of the reference numbers 621 to 62L denotes a complex conjugate circuit for calculating a complex conjugate value of the corresponding estimated CIR g(0), . . . , g(L). Each of the reference numbers 631 to 63L designates a multiplier for multiplying the complex conjugate estimated CIR g(0)*, . . . , g(L)* with the estimated error e (m, n), . . . , e(m, n−L). The reference number 64 indicates a summation circuit for calculating the summation of the above (L+1) multiplied values. The reference number 65 designates a L symbol delay circuit for delaying the re-coded data by L symbols. The reference number 66 denotes a multiplier for multiplying the re-coded data J(m, n−L) by the signal power s, and 67 designates an adder for adding the output value from the summation circuit 67 and the output value from the multiplier 66. Thus, the output value from the adder 67 becomes the new soft-decision data y(m+1, n−L).

Next, a description will be given of the operation of the receiver 9 as the first embodiment.

First, when the receiving section 5 in the receiver 9 receives the received data corresponding to the training sequence 21, the CIR estimator 11 in the received data extractor 6 calculates estimated CIR g(0), . . . , g(L) by using the known training sequence I(n). In the example of the first embodiment, the CIR estimator 11 calculates the estimated CIR g(0, n), g(1, n), . . . , g(L, n) by using the Least Mean Square (LMS) algorithm. The calculation of the LMS algorithm is expressed by the following equation (1):

$$g(i, n)=g(i, n-1)+\alpha\{r(n)-\Sigma g(j, n-1)\cdot I(n-j)\times I(n-i)^* \quad (1)$$

wherein i=0, . . . ,L, n=L+1, . . . , N1, the sum $\Sigma$ is derived for i=0, . . . , L, $\alpha$ designates a step size of the LMS algorithm, and the initial values g(0, L), g(1, L), . . . , g(L, L) of the estimated CIR are set by optional values. In addition, n indicates a time at each burst, N1 denotes a time of the final symbol in the training sequence. Further, the estimated CIR g(0, N1), g(1, N1), . . . , g(L, N1) at n=N1 become the estimated CIR g(0), g(1), . . . , g(L) outputted from the CIR estimator 11. In the first embodiment, the LMS algorithm is used, the present invention is not limited by the above case, for example, it is possible to obtain the above estimated CIR by using other algorithm, such as the Recursive Least Squares (RLS) algorithm as adaptation algorithm and a method using a correlation between the received signals and the training sequence. Following this, the virtual decision circuit 12 performs the decision of the received signals based on the estimated CIR g(0), g(1), . . . , g(L) outputted from the CIR estimator 11 and the received signal sequence r(n) and outputs the virtual decision data y(0, n). Specifically, instead of the virtual decision circuit 12, it is possible to use a linear equalizer, a maximum-likelihood sequence estimator, a soft-decision output equalizer, a decision feedback equalizer and a decision feedback sequence estimator and the like. It is also possible that the virtual decision circuit 12 performs the hard-decision or the soft-decision.

The virtual decision data y(0, n) obtained by the foregoing manner are transmitted to the deinterleaver 14 through the switching circuit 13. The deinterleaver 14 arranges the sequence of the virtual decision data y(0, n) into the original data sequence.

The arranged virtual data y(0, n) are inputted into the decoder 15. This decoder 15 decodes the arranged virtual data outputted from the deinterleaver 14 and then generates the virtual received data.

Because the coder 2 in the transmitter 8 shown in FIG. 1 performs convolutional coding, the receiver 9 of the first embodiment performs Viterbi decoding. This Viterbi decoding may correct bit errors caused in data sequence.

The virtual received data obtained by the above manner are inputted into the re-coder 16. The re-corder 16 in the receiver 9 performs convolutional coding like the coder 2 in the transmitter 8. Furthermore, after convolutional coding, The virtual received data are inputted into the interleaver 17. The interleaver 17 arranges the virtual received data by using the same manner of the interleaver 3 in the transmitter 8. Accordingly, the interleaver 17 outputs the re-coded data that are equal to the transmission signal when both the virtual received data and the transmission data are same. The re-coded data are inputted to the soft-decision circuit 18.

Specifically, the processing by the soft-decision circuit 18 may be represented by the following equations (2), (3), and (4):

$$s = \Sigma ABS\ (g(i))^2 \qquad (2)$$

$$e(0, n) = r(n) - \Sigma g(i) J(0, n-i),\ \text{where}\ n=N1+1, \ldots, N2+L \qquad (3)$$

$$Y(1, n-L) = \Sigma e(0, n-L+i) g(i)^* + J(0, n-L)s,\ \text{where}\ n=N1+L+1, \ldots, N2+L \qquad (4),$$

wherein the sum $\Sigma$ in each equation (2), (3), (4) derived for $i=0, \ldots, L$, where ABS(a) represents the absolute value of a complex number a, s represents the signal power, N1 represents the time of the final symbol in a training sequence, N2 represents the time of the final symbol in a data sequence. Further, the hard-decision value J(0, n) is equal to I(n) in the range of $n \leq N1$ and $n \geq N2$. Moreover, I(n) (where $n \leq N1$) is a training sequence, and I(n) (where n>N) becomes the tail 23 shown in FIG. 2.

The above soft-decision data y(1, n) are inputted to the deinterleaver 14 and the decoder 15 through the switching circuit 13 so as to output the corrected virtual received data.

Thus, by using the data correction loop comprising the re-coder 16, the interleaver 17, the soft-decision circuit 18, the switching circuit 13, the deinterleaver 14, and the decoder 15, the pseudo received signal is generated based on the virtual received data, and the virtual received data are corrected based on the difference between the pseudo received data and the received data, so that the virtual received data approaches the transmission data gradually and it is possible to reduce the number of error bits.

Figure 8:
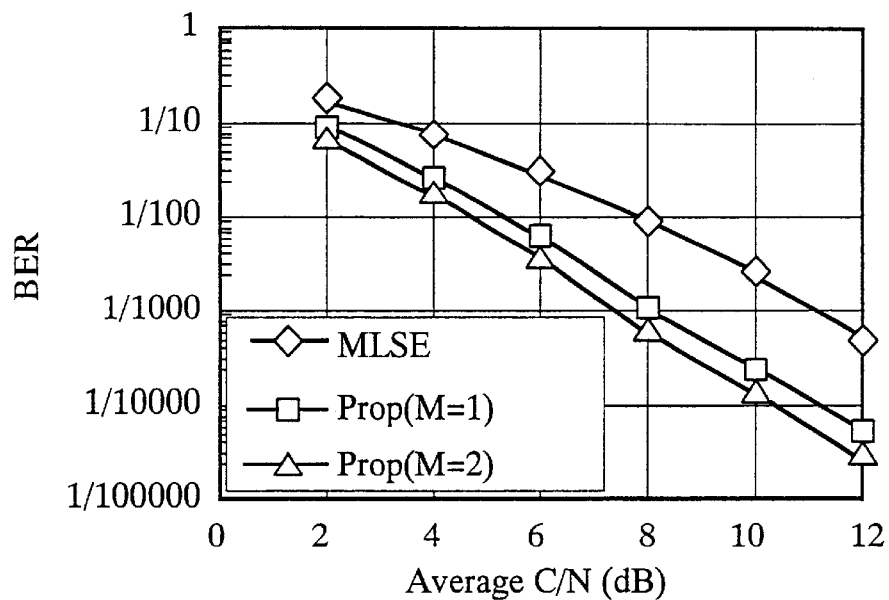
FIG. 8 is an explanation diagram showing incidence of a bit error rate (BER) of received data in each of the receiver of the first embodiment and the conventional receiver of a MLSE method.

FIG. 8 is an explanation graph showing incidence of a bit error rate (BER) of received data in each of the receiver 9 of the first embodiment and the conventional receiver using a MLSE. In FIG. 9, the case Prop (M=1) indicates the BER of received data where the virtual received data are corrected one time by the data correction loop. Further, in FIG. 8, the case Prop (M=2) indicates the BER of the received data where the virtual received data are corrected twice by the data correction loop. Moreover, the case MLSE in FIG. 8 indicates the BER of the conventional receiver using the MLSE.

As is apparent from FIG. 8, the receiver 9 of the first embodiment is capable of obtaining received data having a very lower BER when comparing with the conventional one. Moreover, in FIG. 8, the horizontal line shows the average rate (dB) of the transmission power C and noise power N. As is also apparent from FIG. 8, the receiver 9 as the first embodiment has a lower BER.

As described above, according to the first embodiment of the present invention, because the error rate at the output of the decoder 15 is improved by using the data correction loop and the data correction operation is repeated, it is possible to obtain the received data having a lower error rate. Accordingly, even if radio transmission channels such as automobile telephones are used for data transmission and the channel impulse response becomes bad, it is possible to extract the received data efficiently, so that it is possible to improve the data error rate of the received data.

Furthermore, by repeating the data correction operation by the data correction loop, it is possible to reduce the number of the error bits in the received data by a simple circuit configuration.

FIGS. 9A to 9H are explanation diagrams showing the error correction process in the data correction loop in the receiver 9 of the first embodiment according to the present invention. In FIGS. 9A to 9H, the reference characters (a) to (f) designate the reference characters (a) to (f) indicating signals in the signal lines as shown in FIG. 3.

When comparing the data of (c) m=0 shown in FIG. 9C with the data of (c) m=1 shown in FIG. 9H, it is apparent that the error section in data are processed by the data correction loop and is converted to the correct data.

Specifically, only the burst error has been described with reference to FIGS. 8 and 9 in the foregoing explanation for the first embodiment of the present invention, the data correction loop may improve the bit error rate and the frame error rate. For example, a data correction loop including no interleaver 17 and the deinterleaver 14 may improve a bit error rate. In addition, it is possible to use the interleave method in which the interleave operation is performed per one burst (that is the data sequence as shown in FIG. 2) or per some bursts.

Second Embodiment

Figure 10:
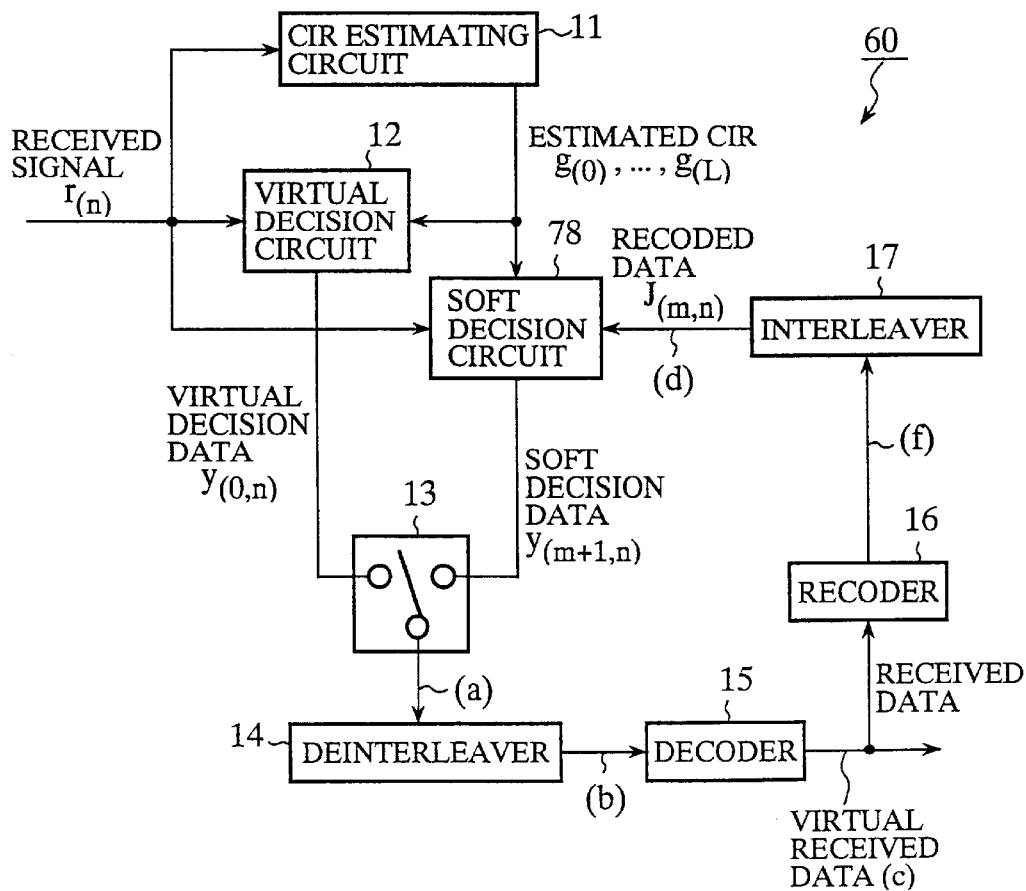
FIG. 10 is a block diagram showing a configuration of a received data extraction section in the receiver according to the second embodiment of the present invention.

FIG. 10 is a block diagram showing a configuration of the received data extractor in the receiver according to the second embodiment of the present invention. In FIG. 10, the reference number 60 designates a received data extraction section, 78 indicates a soft-decision circuit in the received data extraction section 60. This soft-decision circuit 78 updates the estimated CIR by using the re-coded data J(m, n) that have been arranged and then generates the pseudo received signal based on the updated CIR and the arranged re-coded data J(m, n), and further outputs the soft-decision data y(m+1, n) based on the received signal sequence r(n), the estimated error e(m, n), and the updated CIR.

Other components of the receiver of the second embodiment are the same as those of the receiver 9 of the first embodiment, and the same reference number are used for the same components, and the explanation of them is therefore omitted here for brevity.

Figure 11:
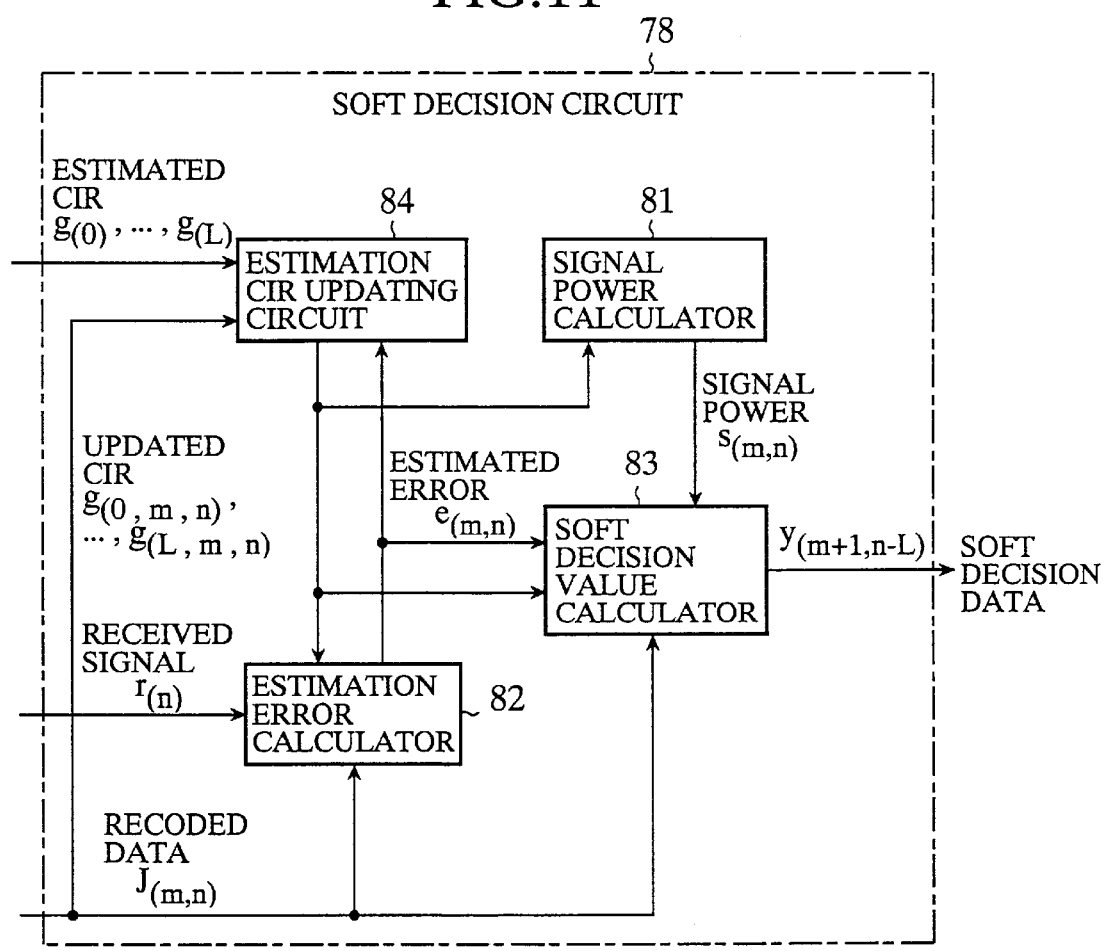
FIG. 11 is a block diagram showing a detailed configuration of a soft-decision circuit shown in FIG. 10.

FIG. 11 is a block diagram showing a detailed configuration of the soft-decision circuit 78 shown in FIG. 10. In FIG. 11, the reference number 84 designates an estimation CIR updating circuit for calculating updated CIR based on the arranged re-coded data J(m, n), the estimated CIR, and the estimated error e(m, n) and for outputting the updated CIR. The updated CIR is inputted into the soft-decision value calculator 83, the estimation error calculator 82, and the signal power calculator 81. The configuration of each of the signal power calculator 81, the estimation error calculator 82, and the soft-decision value calculator 83 is the same as each of the signal power calculator 31, the estimation error calculator 32, and the soft-decision value calculator 33, respectively, therefore the explanation of each is omitted here for brevity.

Figure 12:
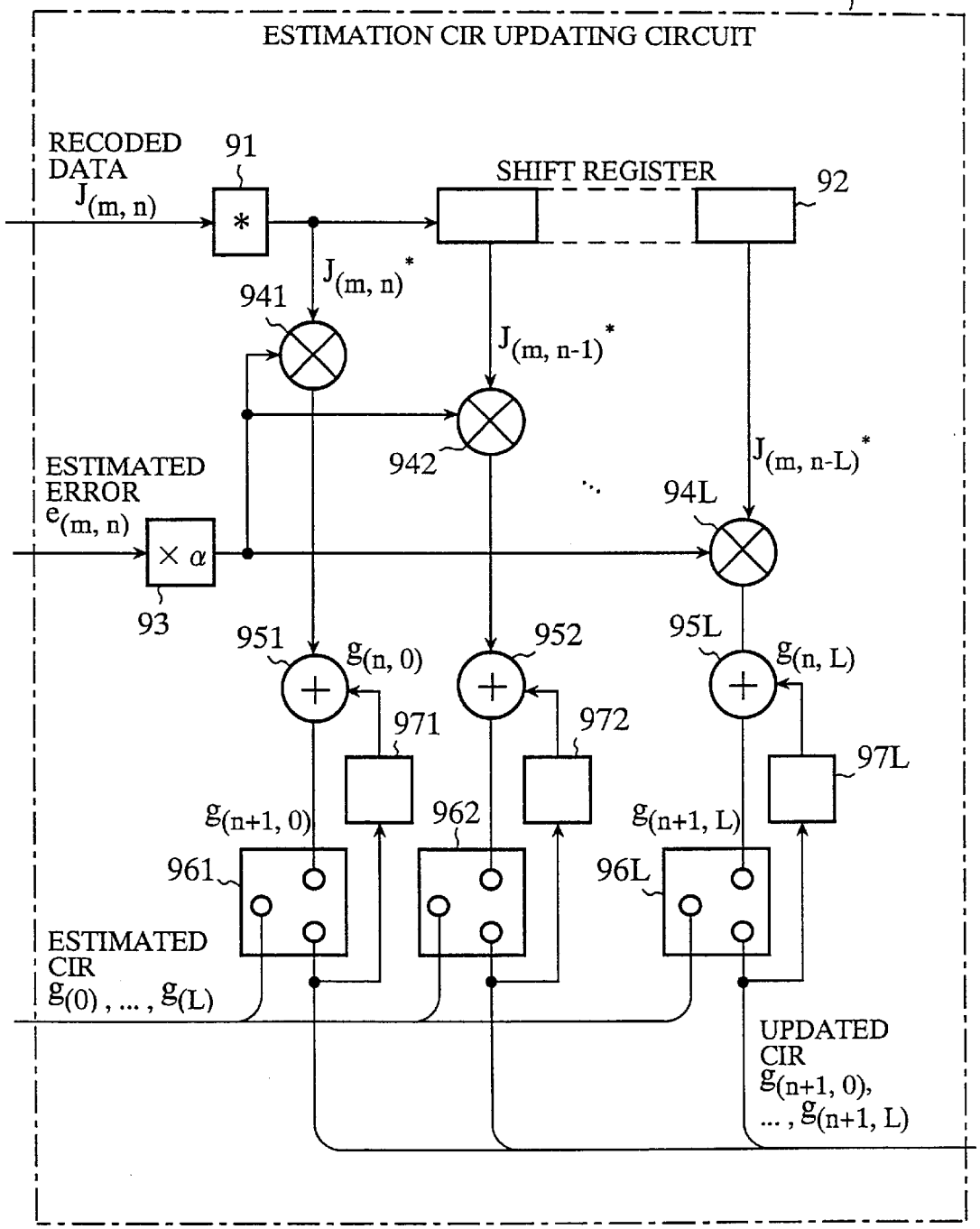
FIG. 12 is a block diagram showing a detailed configuration of an estimation CIR updating circuit shown in FIG. 11.

FIG. 12 is a block diagram showing a detailed configuration of the estimation CIR updating circuit 84 shown in FIG. 11. In FIG. 12, the reference number 91 designates a complex conjugation circuit for calculating a complex conjugation of the re-coded data J(m, n). The reference number 92 denotes a shift register for storing the re-coded data conjugation values J(m, n)* in the range of the (n−1) to (n−L). The reference number 93 indicates a multiplier for setting a correction factor α of the CIR corresponding to the estimated error e(m, n). Each of the reference numbers 941 to 94L designates a multiplier for calculating a CIR correction value corresponding to the correction factor α of the CIR based on the re-coded conjugation value J(m, n)*. Each of the reference numbers 961 to 96L designates a switching circuit for selecting one of the estimated CIR and the updated CIR and for outputting the selected one. Each of the reference numbers 971 to 97L indicates a delay circuit for storing temporarily the preceding CIR outputted from each of the switching circuits. Each of the reference numbers 951 to 95L is an adder for adding the preceding CIR by the CIR correction value. The switching circuits 961 to 96L output the added values outputted from the adders 951 to 95L as the estimated CIR g(0, m, n+1), g(1, m, n+1), . . . ,g(L, m, n+1) at the time n+1 other than the time n=n1+1. In addition to this, at the time n=N1+1, the switching circuits 961 to 96L also output the estimated CIR g(0), g(1), . . . ,g(L) outputted from the CIR estimator 11 as the estimated CIR g(0, m, N1+1), g(1, m, N1+1), . . . ,g(L, m, N1+1) at the time n=N1+1.

Next, a description will be given of the operation of the receiver of the second embodiment.

Because the components other than the soft-decision circuit 84 in the receiver of the second embodiment are operable in the same manner of the components in the receiver 9 of the first embodiment, the operation of the soft-decision circuit 78 will be described in the following explanation.

First, the soft-decision circuit 78 generates a pseudo received signal by performing the convolutional operation between the re-coded data and the estimated CIR that has been outputted from the estimation CIR updating circuit 84.

Next, the estimation error calculator 82 compares the pseudo received signal with the received signal r(n) so as to estimates the estimated error e(m, n) of the pseudo received signal corresponding to the received signal r(n).

Finally, the soft-decision calculator 83 calculates the soft-decision data y(1, n–L) by performing the convolutional operation between multiplied values and the updated CIR g(L, 0, n), . . . , g(0, 0, n). The above multiplied values are obtained by multiplying the transmission power s(m, n) outputted from the signal power calculator 81 by the re-coded data J(0, n).

Specifically, the signal power calculator 81, the estimation error calculator 82, the soft-decision calculator 83, and the estimation CIR updating circuit 84 perform the above calculation in the range of n=N1+1 to N2+L, repeatedly.

The processing of the soft-decision circuit 78 may be expressed by the following equations (5) to (9):

$$g(i, m, N1+1)=g(i) \quad (5)$$

$$s(m,n)=\Sigma ABS(g(i,m,n))^2 \quad (6)$$

$$e(m,n)=r(n)-\Sigma g(i,m,n) \cdot J(m,n-i) \quad (7)$$

$$y(m+1,n-L)=\Sigma e(m,n-L+i) \cdot g(i,m,n)^* + J(m,n-L) \cdot s(m,n) \quad (8)$$

$$g(i, m, n+1)=g(i, m, n)+\alpha \cdot e(m,n) \cdot J(m, n-i)^* \text{ where } i=0, \ldots, L \quad (9)$$

wherein the sum $\Sigma$ in each equation is derived for i=0, . . . , L, and s(m, n) is a signal power, e(m, n) is an estimated error, the hard-decision value (the re-coded data) J(m, n) becomes J(m, n)=I(n) in the range of n≦N1, n≧N2. In addition, the I(n) designates a training sequence (n≦N1), I(n) denotes a tail (n>N2).

As described above, according to the receiver of the second embodiment, because the data correction loop (that comprises the re-coder 16, the interleaver 17, the soft-decision circuit 78, the switching circuit 13, the deinterleaver 14, and the decoder 15 shown in FIG. 10) improve the error rate at the output of the decoder 15 and the above correction operation is repeated by the data correction loop, it is possible to obtain the received data having a lower error rate. Therefore even if radio transmission channels such as automobile telephones are used for data transmission and the channel impulse response becomes bad in time during mobile communication, it is possible to extract the received data efficiently while keeping the data transmission characteristic, so that it is possible to improve the data error rate of the received data.

Furthermore, by repeating the operation of the above data correction loop, it is possible to reduce the number of the error bits in the received data by a simple circuit configuration.

Moreover, it is possible to form the function of the soft-decision circuit 78 by using the following processes. In this case, the block diagram of the soft-decision circuit 78 shown in FIG. 11 may be changed to other equivalent block diagram by modifying the following equations:

$$g(i, n, N1)=g(i) \quad (10)$$

$$e(m, n)=r(n)-\Sigma g)(i, m, n-1) \cdot J(m, n-i) \quad (11)$$

$$g(i, m, n)=g(i, m, n-1)+\alpha \cdot e(m, n) \cdot J(m, n-i)^* \text{ wherein } i=0, \ldots, L \quad (12)$$

$$s(m, n)=\Sigma ABS(g(i, m, n))^2 \quad (13)$$

$$y(m+1, n-L)=\Sigma e(m, n-L+i) \cdot g(i, m, n)^* + J(m, n-L) \cdot s(m, n) \quad (14).$$

Third Embodiment

Figure 13:
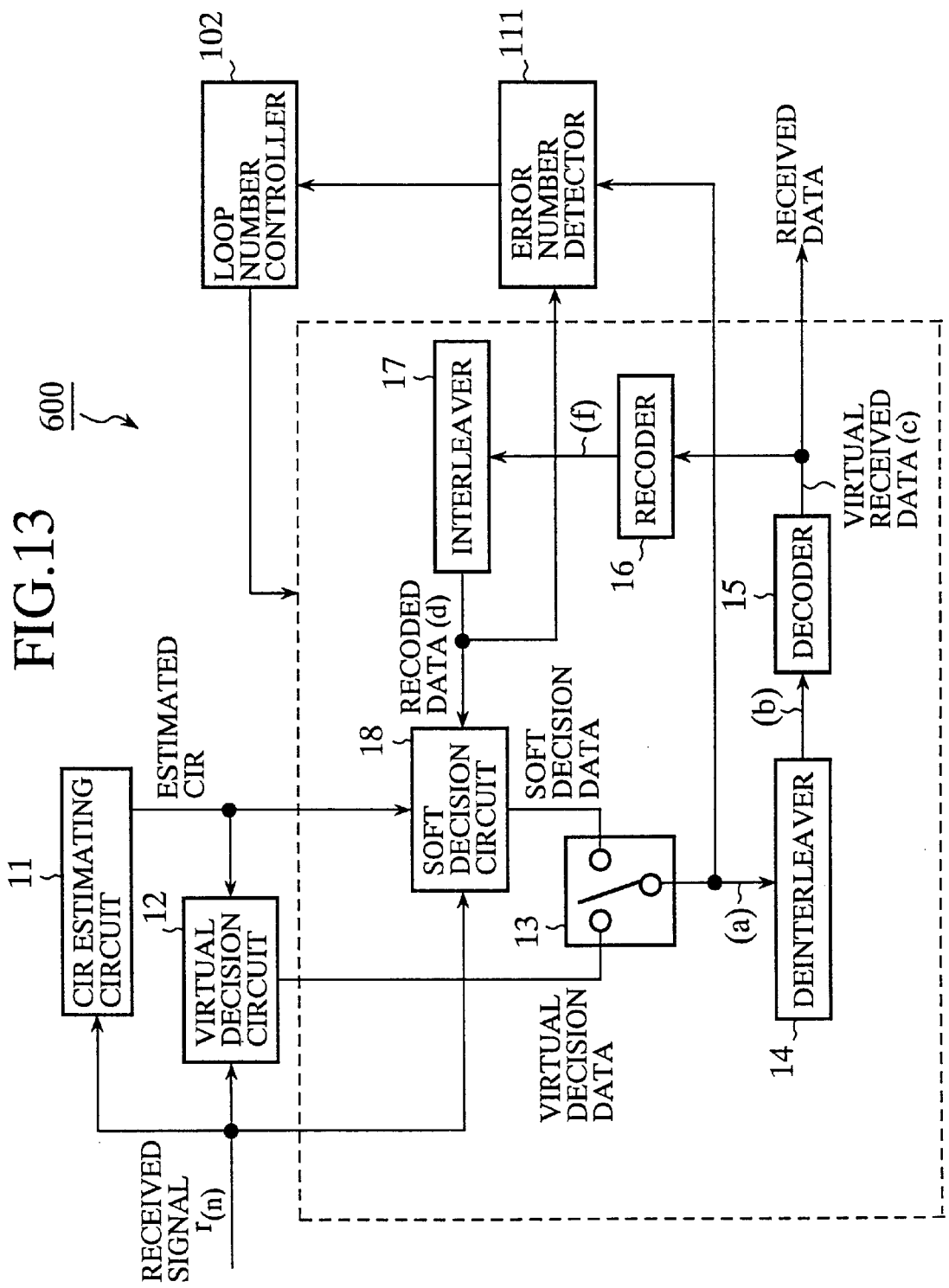
FIG. 13 is a block diagram showing a detailed configuration of a received data extraction section in the receiver of the third embodiment according to the present invention.

FIG. 13 is a block diagram showing a detailed configuration of the received data extraction section 600 in the receiver as the third embodiment according to the present invention. In FIG. 13, the reference number 111 designates an error number detector for comparing the virtual decision data or the soft-decision data y(m, n) with the re-coded data so as to count the number of different bits as error number. The reference number 102 denotes a loop number controller for halting the operation of the data correction loop, that comprises the re-coder 16, the interleaver 17, the soft-decision circuit 18, the switching circuit 13, the deinterleaver 14, and the decoder 15, when the number of the error bits is lower than a predetermined value, and for outputting the final virtual received data as the received data. Other components of the receiver of the third embodiment are the same as the components of the receiver 9 of the first embodiment, and the same reference number are used for the same components, and the explanation of them is therefore omitted here for brevity.

Next, a description will be given of the operation of the receiver as the third embodiment.

The error number detector 111 compares the soft-decision data y(m, n) outputted from the soft-decision circuit 18 with the re-coded data outputted from the interleaver 17, and detects the number of different bits between them and for outputting the number of the different bits as the error number.

The loop number controller 102 halts the operations of the deinterleaver 14, the decoder 15, the re-corder 16, interleaver 17, and the soft-decision circuit 18 when the number of the error bits outputted from the error number detector 101, and the loop number controller 102 outputs the output from the decoder 15 as the received data.

Because other operations are the same as the operation of the received data extraction section 6 in the receiver 9 of the first embodiment, the explanation of them is therefore omitted here.

As described above, according to the receiver of the third embodiment, the error number detector 111 in the received data extraction section 600 detects the number of difference bits (as the number of error bits) between the soft-decision data y(m, n) and the re-coded data before the loop number reaches a predetermined loop number, and the loop number controller 102 in the received data extraction section 600 halts the operations of the loop correction operation when the error rate is reached to a constant value. Therefore it is possible to reduce the error rate of data and also to reduce an average number of the operations of the data correction loop in addition to the effect of the receiver 9 of the first embodiment.

In addition, it is possible to have the same effect of the third embodiment described above, for example, the error number detector 111 and the loop number controller 102 in the received data extraction section 600 in the receiver of the third embodiment are combined with the received data extraction section 60 in the receiver of the second embodiment.

Fourth Embodiment

Figure 14:
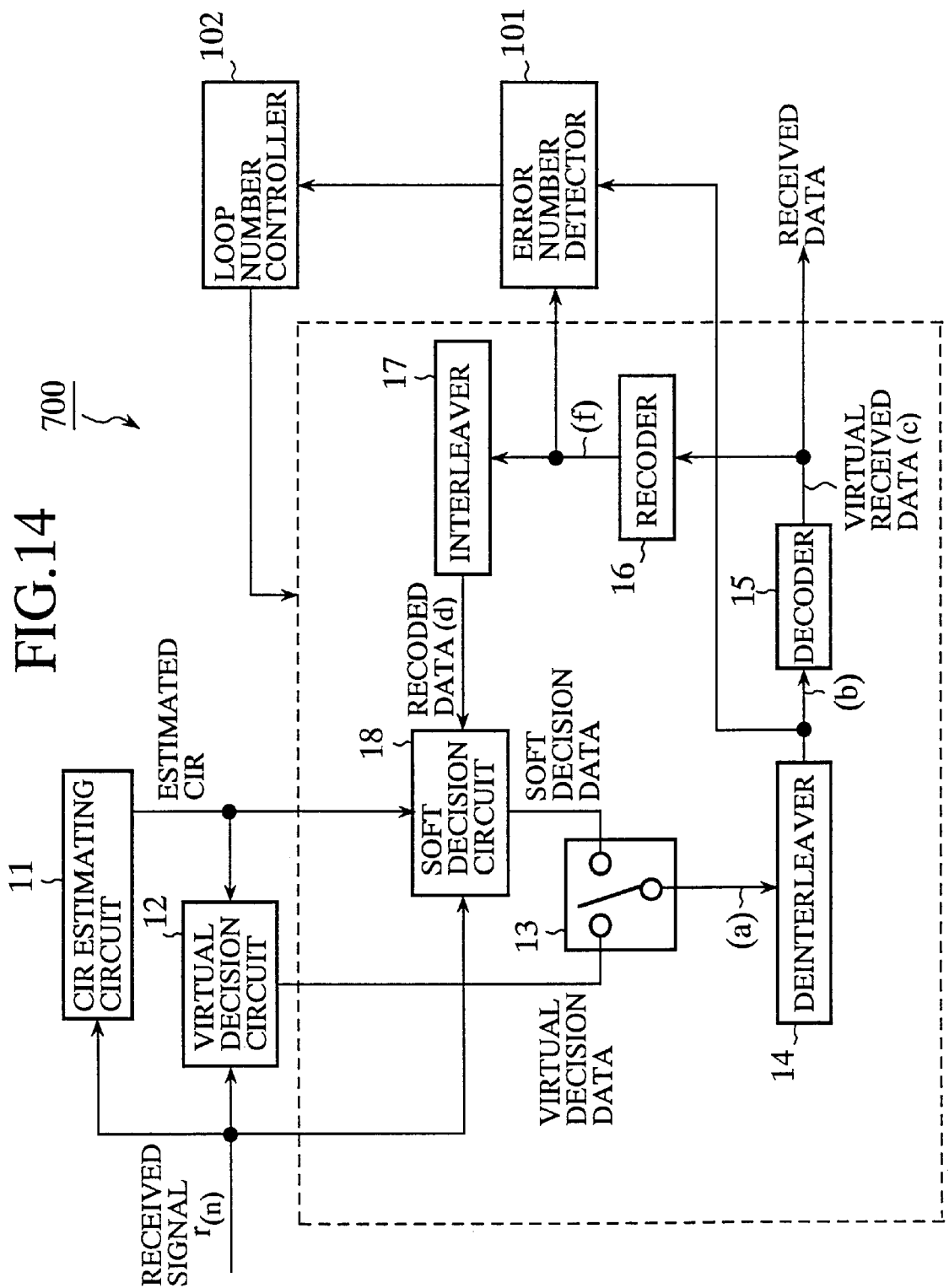
FIG. 14 is a block diagram showing a detailed configuration of a received data extraction section in the receiver of the fourth embodiment according to the present invention.

FIG. 14 is a block diagram showing a detailed configuration of the received data extraction section 700 in the receiver of the fourth embodiment according to the present invention. In FIG. 14, the reference number 101 designates an error number detector for comparing the virtual decision data or the soft-decision data that have been arranged into the original sequence with the re-coded data that are the data before the interleaver 17 arranges the data so as to count the number of different bits and for outputting the number of the different bits as the error number. The reference number 102 denotes a loop number controller for halting the processing of the data correction loop, that comprises the re-coder 16, the interleaver 17, the soft-decision circuit 18, the switching circuit 13, the deinterleaver 14, and the decoder 15, when the number of the error bits is lower than a predetermined value, and for outputting the final virtual received data as the received data. Other components of the receiver of the fourth embodiment are the same as the components in the received data extraction section 6 in the receiver 9 of the first embodiment, and therefore the same reference number are used for the same components, and the explanation of them is omitted here for brevity.

Next, a description will be given of the operation of the receiver as the fourth embodiment.

The error number detector 101 in the received data extraction section 700 compares the soft-decision data y(m, n) that have been arranged into the original sequence with the re-coded data that are the data before the interleaver 17 receives the data and counts the number of the sum of different bits that have different signs to each other, and then outputs the number of the sum of the different bits as the error number. The loop number controller 102 halts the operations of the deinterleaver 14, the decoder 15, the re-corder 16, the interleaver 17, and the soft-decision circuit 18 forming the data correction loop when the number of the error bits outputted from the error number detector 101 is lower than a predetermined threshold value, and at this time outputs the output from the decoder 15 as the received data.

Because other operations in the received data extraction section 700 in the receiver as the fourth embodiment are the same as the operation of the received data extraction section 6 in the receiver 9 of the first embodiment, the explanation of them is therefore omitted here.

As described above, according to the received data extraction section 700 in the receiver as the fourth embodiment of the present invention, the error number detector 101 in the received data extraction section 700 detects the number of difference bits (as the number of error bits) between the soft-decision data y(m, n) and the re-coded data before the loop number reaches a predetermined loop number, and the loop number controller 102 in the received data extraction section 700 halts the operations of the loop correction operation when the error rate is reached to a constant value. Therefore it is possible to reduce the error rate of data and also to reduce an average number of the operations of the data correction loop in addition to the effect of the receiver 9 of the first embodiment.

In addition, it is possible to have the same effect of the fourth embodiment described above, for example, the error number detector 101 and the loop number controller 102 in the received data extraction section 700 in the receiver of the fourth embodiment are combined with the received data extraction section 60 in the receiver of the second embodiment.

Fifth Embodiment

Figure 15:
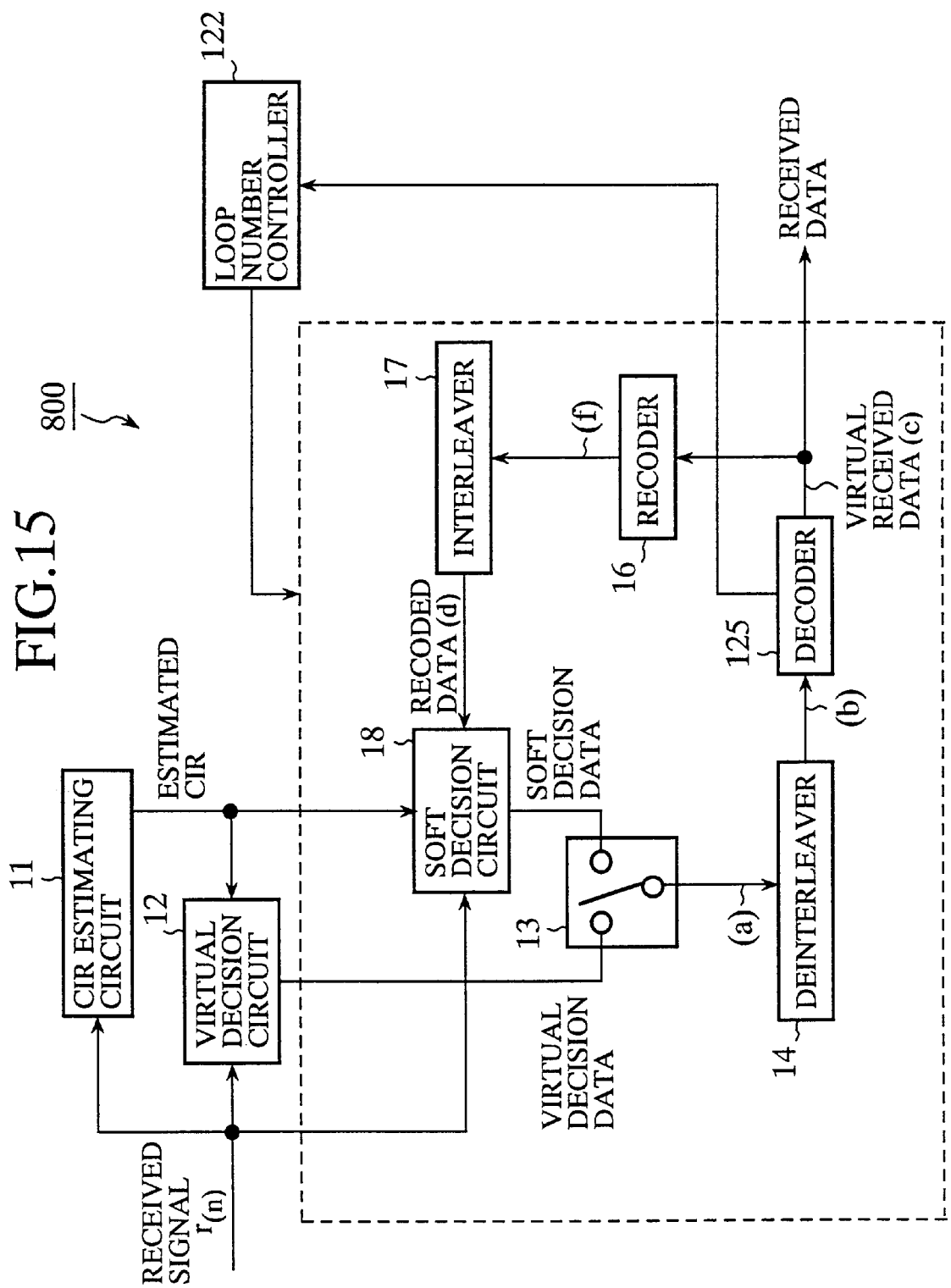
FIG. 15 is a block diagram showing a detailed configuration of a received data extraction section in the receiver of the fifth embodiment according to the present invention.

FIG. 15 is a block diagram showing a detailed configuration of the received data extraction section 800 in the receiver of the fifth embodiment according to the present invention. In FIG. 15, the reference number 125 designates a decoder for performing an error detection based on a known error detection technique that utilizes cyclic codes or fire codes when the data correction and data decoding operations perform, and for outputting virtual received data (as decoded data) and error detection result. The reference number 122 denotes a loop number controller for halting the operation of the data correction loop, that comprises the re-coder 16, the interleaver 17, the soft-decision circuit 18, the switching circuit 13, the deinterleaver 14, and the decoder 125, based on the error detection result outputted from the decoder 125, and for outputting the final virtual received data as the received data.

Other components of the receiver of the fifth embodiment are the same as the components in the received data extraction section 6 in the receiver 9 of the first embodiment, and therefore the same reference number are used for the same components, and the explanation of them is omitted here for brevity.

Next, a description will be given of the operation of the receiver as the fifth embodiment.

The decoder 125 performs an error detection operation based on a known error detection technique that utilizes cyclic codes or fire codes when the data correction and data decoding operations perform, and outputs virtual received data (as decoded data) and error detection result. The loop number controller 122 halts the operations of the deinterleaver 14, the decoder 125, the re-coder 16, the interleaver 17, and the soft-decision circuit 18 forming the data correction loop when the number of the operation of the data correction loop is reached to a predetermined loop number M or when the error detection result outputted from the decoder 125 indicates no error. At this time, the decoded data outputted from the decoder 125 become the output data of the receiver of the fifth embodiment.

Because other operations in the received data extraction section 800 in the receiver as the fifth embodiment are the same as the operation of the received data extraction section 6 in the receiver 9 of the first embodiment, the explanation of them is therefore omitted here.

As described above, according to the received data extraction section 800 in the receiver as the fifth embodiment of the present invention, the operation of the error correction loop is halted during the decoding operation performed by the decoder 125 before the number of operations of the data error loop is reached to the predetermined number. Therefore it is possible to reduce the error rate of data and also to reduce an average number of the operations of the data correction loop in addition to the effect of the receiver 9 of the first embodiment.

In addition, it is possible to have the same effect of the fifth embodiment described above, for example, the decoder 125 and the loop number controller 122 in the received data extraction section 800 in the receiver of the fifth embodiment are combined with the received data extraction section 60 in the receiver of the second embodiment.

Sixth Embodiment

Figure 16:
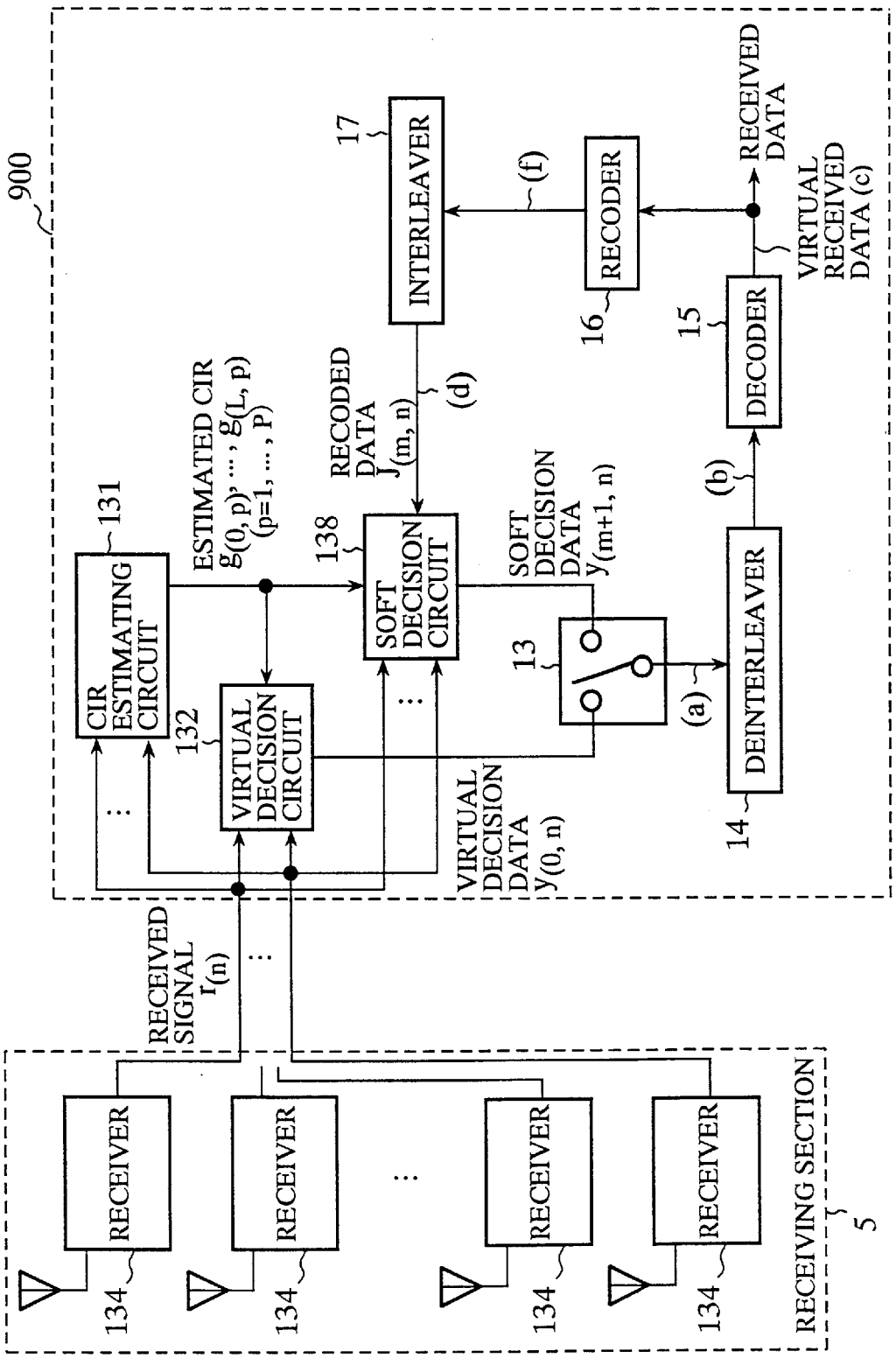
FIG. 16 is a block diagram showing a detailed configuration of a receiving section and a received data extraction section in the receiver of the sixth embodiment according to the present invention.

FIG. 16 is a block diagram showing a detailed configuration of the receiving section and the received data extraction section 900 in the receiver of the sixth embodiment according to the present invention. In FIG. 16, the reference numbers 134 designate P (P≧1) receiving means that are located at different points and may receive same transmission signals. The reference number 131 denotes a CIR estimator for estimating CIR based on the received signals that are received by the P receiving means located at different points. The reference number 132 indicates a virtual decision-circuit for outputting virtual-decision data based on the received data obtained by the P receiving means 134. The reference number 138 indicates a soft-decision circuit for performing a soft decision operation based on the received signals.

Other components of the receiver of the sixth embodiment are the same as the components in the receiver 9 of the first embodiment, and therefore the same reference number are used for the same components, and the explanation of them is omitted here for brevity.

Next, a description will be given of the operation of the receiver as the sixth embodiment.

First, the CIR estimator 131 estimates the estimated CIR in each of the receiving means 134 based on a training sequence 21 shown in FIG. 2 in each received signal. There is a Least Mean Square (LMS) algorithm as one example of this estimation operation. The LMS algorithm may be represented by the following equation (15):

$$g(i, n, p) = g(i, n-1, p) + \alpha \cdot \{r(n, p) - \Sigma g(j, n-1, p) \cdot I(n-j)\} \cdot I(n-i)^*$$
wherein $i=0, \ldots, L, p=0, \ldots, P, n=L+1, \ldots, N1$ (15), wherein the total sum Σ is derived for the range J=0, ... L, and a* denotes a complex conjugate of a complex number a. In addition, α indicates a step size of the LMS algorithm, and optional values are used for initial values of the estimated CIR g(0, L, p), g(1, L, p), ..., g(L, L, p), wherein p=1, ..., P. Further, N1 designates the time corresponding to the final symbol in the training sequence. The estimated CIR g(0, N1, p), g(1, N1, p), ..., g(L, N1, p) at n=N1 become the estimated CIR g(0, p), g(1, p), ..., g(L, p) outputted from the CIR estimator 131. Although the LMS algorithm is used in the sixth embodiment, the present invention is not limited by this example, for example, it is possible to obtain the above estimated CIR by using other methods, for inputting P received signals r(n, p) p=1, ..., P as the training sequence and for estimating the estimated CIR by using a known technique such as the Recursive Least Squares (RLS) algorithm as adaptation algorithm and a method calculating a correlation between the received signals and the training sequence.

Next, the virtual decision circuit 132 performs the virtual decision operation of the data sequence of each received signal based on the estimated CIR that is obtained for each received signal. It is possible to use other circuits as the virtual decision circuit 132, for example, a linear equalizer, a maximum-likelihood sequence estimator, a soft-decision output equalizer, a decision feedback equalizer, and a decision feedback sequence estimator and the like.

The virtual decision data for each received signal is processed by the deinterleaver 14 and the re-corder 16 so as to output the virtual received data.

The soft-decision circuit 138 inputs the re-coded data J(m, n) as hard-decision data outputted from the interleaver 17, each received signal r(n, p) p=1,..., P, the estimated CIR g(0, p), g81, p), ..., g(L, p) p=1, ... P, and then calculates them in order to obtain the soft-decision value y(1, n) by using the following equations (16), (17), and (18):

$$s = \Sigma\Sigma ABS(g(i, p))^2 \quad (16),$$

$$e(0, n, p) = r(n, p) - \Sigma g(i, p) \cdot J(0, n-i) \text{ wherein } p=1, \ldots, P, n=N1+1, \ldots, N2+L \quad (17),$$

$$y(1, n-L) = \Sigma\Sigma e(0, n-L+i, p) \cdot g(i, p)^* + J(0, n-L) \cdot s, n=N1+L+1, \ldots, N2+L \quad (18),$$

wherein the outer sum Σ in each of the equations (16) and (18) is derived for p=1, ..., P, and the inner sum Σ in each of the equations (16) and (18) is derived for i=0, ..., L, and wherein ABS(a) represents the absolute value of a complex number a, s represents the signal power, e(m, n, p) p=1, ..., P designates an estimated error, N1 represents the time of the final symbol in a training sequence, N2 represents the time of the final symbol in a data sequence. Further, the hard-decision value J(m, n) is equal to J(m, n) in the range of n≦N1 and n>N2. Moreover, I(n) (where n≦N1) is a training sequence, and I(n) (where n>N) becomes the tail 23 shown in FIG. 2.

The final virtual received data that have been outputted at the final time from the decoder 15 are outputted as the received data. The operation of the loop formed by the switching circuit 13, the deinterleaver 14, the decoder 15, the re-coder 16, the interleaver 17, and the soft-decision circuit 138 may be performed M times repeatedly by the same manner described above in order to obtain the soft-decision data y(M, n). Specifically, in the above case, the deinterleaver 14 inputs the soft-decision value y(m, n) m=1, ..., M outputted from the soft-decision circuit 138 through the switching circuit 13.

As described above, according to the receiver of the sixth embodiment of the present invention, because the diversity receiving in which a plurality of receiving means 134 receive the same transmission signal simultaneously, it is possible to further decrease the error rate of the received data that are finally obtained after the completion of the decoding operation in addition to the effect of the receiver of the first embodiment.

In addition, it is possible to have the same effect of the sixth embodiment described above, for example, the soft-decision circuit 138 of the sixth embodiment has other configuration that is obtained by changing the configuration represented by the equations (15), (16), and (17) described above. Furthermore, it is possible to combine the configurations of the second embodiment to the fifth embodiment with the configuration of the sixth embodiment for various applications.

Seventh Embodiment

Figure 17:
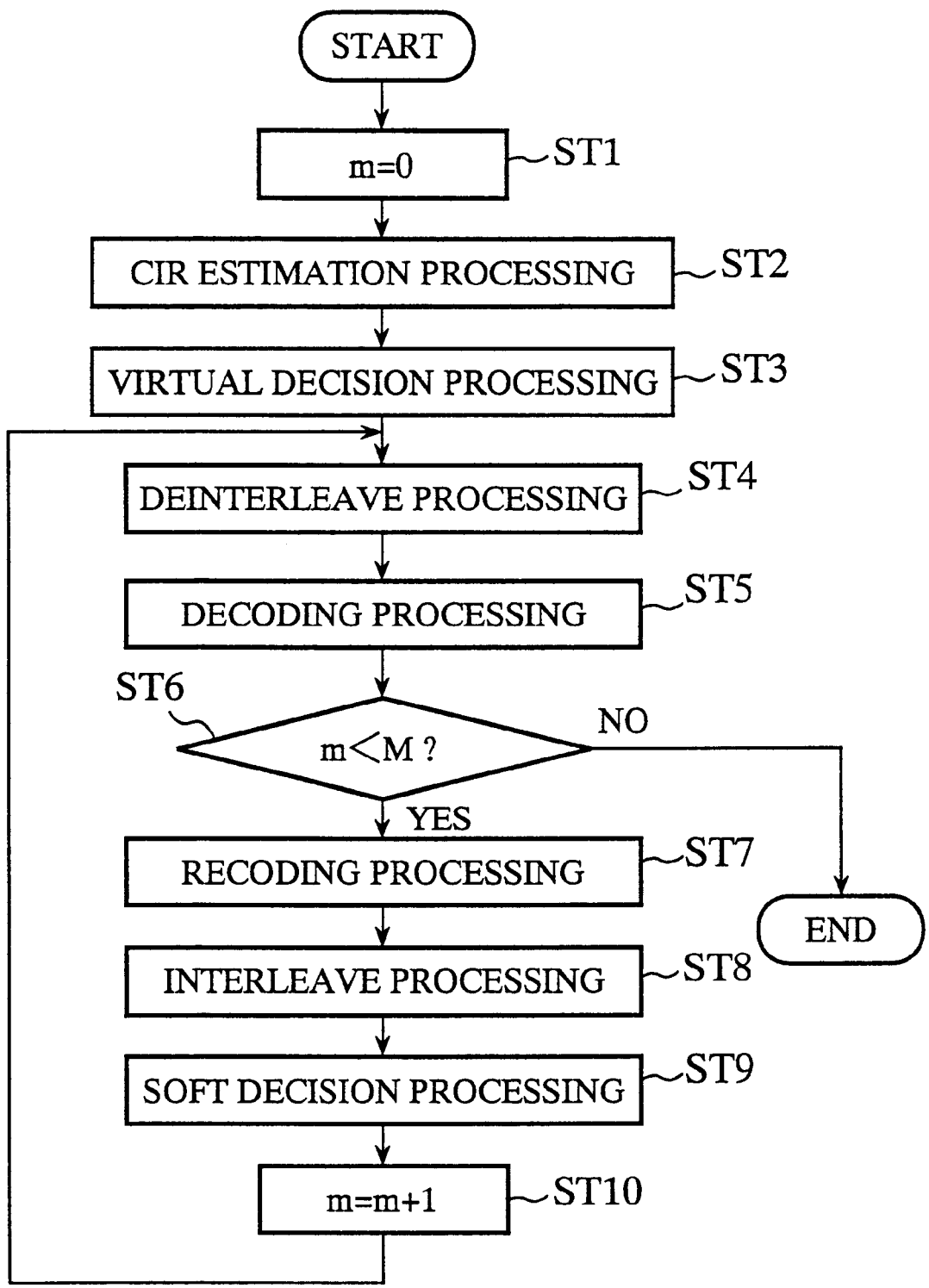
FIG. 17 is a flow chart showing a received data extracting program to be executed incorporated in the receiver of the seventh embodiment according to the present invention.
Figure 18:
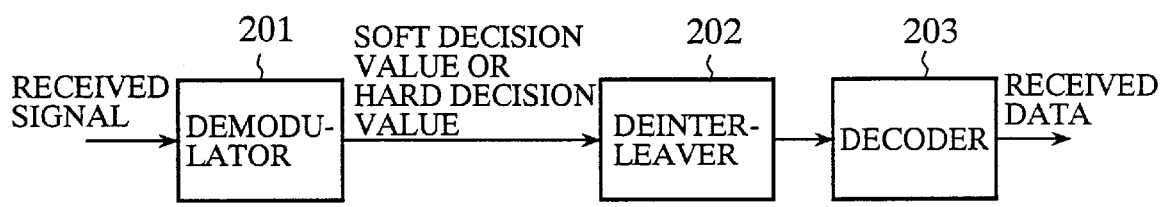
FIG. 18 is a block diagram showing a conventional receiver including a received data extraction section.
Figure 19:
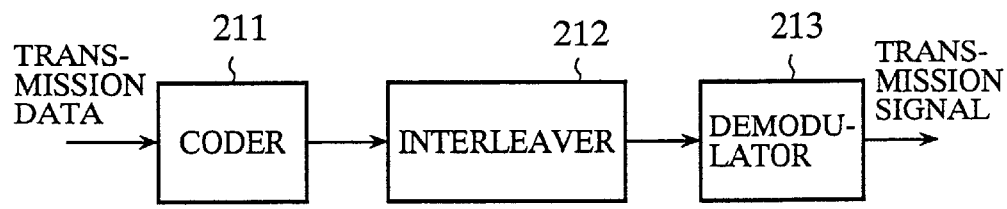
FIG. 19 is a block diagram showing a conventional transmitter including a transmission signal generator.

FIG. 17 is a flow chart showing a received data extracting program to be executed incorporated in the receiver of the seventh embodiment according to the present invention. The process to be executed by the flow chart shown in FIG. 17 performs about sampling data obtained by sampling the received signal. In FIG. 17, Step ST1 is a reset step in which the content stored in a counter m for storing the number of the loop correction processes is reset. Step ST2 is a CIR estimation step in which CIR for the data transmission channel is estimated based on the sampling data of a training sequence. Step ST3 is a virtual decision step in which a decision for each sampling data in the data sequence of the received signal is performed based on the estimated CIR obtained in Step ST2 and the virtual decision data are outputted. Step ST4 is a deinterleave step in which the sequence of the virtual decision data obtained in Step ST3 is arranged to an original sequence. Step ST5 is a decoding step in which the virtual decision data that have been arranged to the original sequence executed in Step ST4 are decoded and the decoded data are outputted as the virtual decision data. Step ST6 is a loop decision step in which it is checked whether or not the number of the process is reached to a predetermined processing number M. In the loop decision process step ST6, when the relationship m=M is satisfied, the virtual received data obtained in Step ST5 are outputted as the received data. On the other hand, when m>M, the processing flow goes to Step ST7. Step ST7 is a re-cording step in which the virtual received data are re-coded and the re-coded data are outputted. This operation is the same operation of the coder in the transmitter. Step ST8 is an interleave step in which the re-coded data J(m, n) obtained by Step ST7 that have been arranged are outputted by the same manner of the interleaver in the transmitter. Step ST9 is a a soft-decision step in which pseudo received signal is generated based on the arranged re-coded data J(m, n) obtained in Step ST8 and the estimated CIR obtained by Step ST2, an estimation error e(m, n) of the pseudo received signal corresponding to the received signal is estimated, further a-new soft-decision data y(m+1, n) that has been added by the estimated error e(m, n) is outputted. Step ST10 is a loop count step in which the counter value of the loop correction processing number counter m is incremented by one. The loop processing from Step ST4 to Step ST10 is repeated until the m=M is satisfied by the decision processing at the loop decision step ST6.

When a program executing the processes described above is stored in a recording medium such as a random access memory, or a read only memory, or other types of memory means, and when the recording medium storing the program is incorporated in a microcomputer (not shown), and when the receiver of the seventh embodiment has the microcomputer incorporating the recording medium, like the receiver 9 of the first embodiment, it is possible to obtain the received data having a lower data error rate. Accordingly, even if radio transmission channels such as automobile telephones are used for data transmission and the channel impulse response becomes bad during mobile communication, it is possible to extract the received data efficiently, so that it is possible to improve the data error rate of the received data.

As set forth, according to the present invention, a transmitter in a data transmission system outputs transmission signals corresponding to transmission data after the transmission data are generated by coding processing with error correction, a receiver in the data transmission system receives wave form of the transmission signals, and extracts virtual received data with error correction from the transmission signals, and generates pseudo transmission signals based on the virtual received data, and corrects the virtual received data so that the pseudo transmission signals are approached gradually to the transmission signals transmitted from the transmitter, and uses the corrected virtual received data as the received data. Accordingly, even if radio transmission channels such as automobile telephones are used for data transmission and the channel impulse response becomes bad, it is possible to increase the reliability of the received data and it is also possible to reduce the error rate of the received data when comparing with a conventional receiver.

In addition, according to the present invention, a receiver has a receiving section for receiving transmission signals corresponding to transmission data that have been processed by coding processing with error correction and transmitted from a transmitter, and for outputting received signals, a virtual received data extraction section for correcting the received signals and for decoding the received signals so as to output virtual received data, a pseudo signal generation section for performing calculation processes, that includes the same coding processing performed by the transmitter, for the virtual received data, and for generating pseudo transmitted signals, and a virtual received data correction section for correcting the virtual received data based on the pseudo transmitted signals, the received signals, and a channel impulse response. In the receiver, the corrected virtual received data may be used as the received data. Accordingly, even if radio transmission channels such as automobile telephones are used for data transmission and the channel impulse response becomes bad, it is possible to increase the reliability of the received data and it is also possible to reduce the error rate of the received data when comparing with a conventional receiver.

Furthermore, according to the present invention, a receiver has a receiving section for receiving transmission signals corresponding to transmission data that have been processed by coding processing with error correction and transmitted from a transmitter, and for outputting received signals, virtual decision means for extracting virtual decision data from the received signals based on a channel impulse response through which the transmission data are transmitted, decoding means for performing decoding processing with error correction for the virtual decision data and for generating and outputting virtual received data, re-coding means for performing the coding for the virtual received data, soft-decision means for outputting soft-decision data based on pseudo transmitted signals, the received signals, and the channel impulse response, and switching means for providing the soft-decision data instead of the virtual decision data to the decoding means. In the receiver, the soft-decision data are inputted at least one time into the decoding means, and final virtual received data in the virtual received data outputted from the decoding means are outputted as the received data. Accordingly, it is possible to improving the reliability of the virtual received data (namely, the received data) by repeating the processing loop formed by the decoding means, the re-coding means, the soft-decision means, the switching means, and the like. Moreover, it is also possible to construct the receiver with a simple configuration.

Moreover, in the receiver according to the present invention, the virtual decision means comprises a channel impulse response estimation circuit for estimating the channel impulse response based on the received signals, and a virtual decision circuit for extracting the virtual decision data from the received signals based on the estimated channel impulse response. Accordingly, even if radio transmission channels such as automobile telephones are used for data transmission, because the received data may be regenerated based on the channel impulse response detected by the state of the transmission channel, it is possible to extract the received data efficiently based on the most reliability transmission channel even if the channel impulse response is changed, so that it is possible to reduce the error rate of the received data.

In addition, in the receiver according to the present invention, the soft-decision means comprises a channel impulse response updating circuit for updating the channel impulse response based on the pseudo received signals, and the received signals, and a soft-decision circuit for generating and outputting soft-decision data based on the updated channel impulse response, the pseudo received signals, and the received signals. Accordingly, even if radio transmission channels such as automobile telephones are used for data transmission, because the final virtual received data (as received data) may be regenerated based on the channel impulse response according to the change of the state of the transmission channel in time, it is possible to extract the received data efficiently based on the most reliability transmission channel, so that it is possible to reduce the error rate of the received data.

Furthermore, in the receiver according to the present invention, the decoding means comprises a deinterleave circuit for performing deinterleave processing for the virtual decision data, and a decoding circuit for performing a decoding processing with error correction for the virtual decision data that have been deinterleaved, and the re-coding means comprises a re-coding circuit for performing a same coding processing performed by the transmitter for the virtual received data outputted from the decoding means, and an interleave circuit for performing the same interleave processing performed by the transmitter for the re-coded virtual received data. Accordingly, it is possible to perform the decoding processing after burst errors are diffused and converted to the bit errors, so that it is possible to improve the correcting function of the burst error.

Moreover, in the receiver according to the present invention, the re-coding circuit performs Convolutional coding, and the decoding circuit performs Viterbi decoding. Accordingly, it is possible to reduce the error rate caused by the burst error. In addition to this, it is possible to reduce the error rate caused by the bit error because Viterbi decoding is used.

In addition, the receiver according to the present invention, further comprises an error number detection circuit for comparing the decision data inputted to the decoding means with the re-coded data outputted from the re-coding means in order to count an error number as a number of different bits of the decision data and the re-coded data and for outputting the error number, and a loop number control circuit for controlling whether correction processing for the virtual received data are continued or halted based on the error number outputted from the error number detection circuit. Accordingly, it is possible to eliminate un-required loop processing and possible to obtain the received data having an error number that is lower than a predetermined error number, so that it is possible to reduce the average number of the loop processing.

Furthermore, the receiver according to the present invention, further comprises an error number detection circuit for comparing the data inputted to the interleave circuit with the data outputted from the deinterleave circuit in order to count an error number as a number of different bits of them and for outputting the error number, and a loop number control circuit for controlling whether correction processing for the virtual received data are continued or hated based on the error number outputted from the error number detection circuit. Accordingly, it is possible to eliminate un-required loop processing and possible to obtain the received data having an error number that is lower than a predetermined error number, so that it is possible to reduce the average number of the loop processing.

Moreover, in the receiver according to the present invention, the receiving section comprising a plurality of receiving means that are placed at different points, and each receiving means receives the transmission signals and each receiving means outputs the virtual received data based on the plurality of received signals received by the plurality of receiving means. Accordingly, even if radio transmission channels such as automobile telephones are used for data transmission, it is possible to obtain the most reliability received data in the states of the transmission channels.

Furthermore, according to the present invention, a recording medium stores a program that is readable by a computer, the program performs functions comprising the step of extracting virtual decision data based on received signals based on a channel impulse response through which the received signals are transmitted, the step of performing decoding processing with error correction for the virtual decision data, and outputting virtual received data, the step of performing re-cording for the virtual received data, the step of performing a soft-decision for pseudo transmission signals, the received signals, and the channel impulse response, and outputting soft-decision data, the step of performing a switching processing for inputting the soft-decision data instead of the virtual decision data into the decoding processing, and the step of performing a loop number control processing for inputting the soft-decision data at least one time and outputting final virtual received data in the virtual received data outputted from the decoding processing as the received data. Accordingly, when the receiver incorporates a computer such as a microcomputer having the recording medium, it is possible to correct the received data that are nearly or completely equal to the transmitted data from a transmitter. In addition, even if radio transmission channels such as automobile telephones are used for data transmission, it is possible to increase the reliability of the received data and it is possible to reduce the data error rate of the received data when comparing with the conventional receiver.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A data transmission system comprising:
   a transmitter for outputting transmission signals corresponding to transmission data after said transmission data are generated by coding processing with error correction;
   a receiver for receiving said transmission signals and for generating received signals corresponding to said transmission signals, for extracting virtual received data from said received signals by decoding process (error-correction process), for generating pseudo transmission signals based on said virtual received data, and for correcting said virtual received data so that said pseudo transmission signals are approached gradually to said transmission signals transmitted from said transmitter, and for using said corrected virtual received data as said received data.

2. A receiver comprising:
   a receiving section for receiving transmission signals corresponding to transmission data that have been processed by a coding processing for the purpose of error correction and transmitted from a transmitter, and for outputting received signals;
   a virtual received data extraction section for decoding said received signals for the purpose of error correction, and for outputting virtual received data;
   a pseudo signal generation section for performing calculation processes, that includes said same coding processing performed by said transmitter, for said virtual received data, and for generating pseudo transmission signals; and a virtual received data correction section for correcting said virtual received data based on said pseudo transmission signals, said received signals, and a channel impulse response through which said transmission signals are transmitted, and for using said corrected virtual received data as said received data.

3. A receiver comprising:

a receiving section for receiving transmission signals corresponding to transmission data that have been processed by coding processing for the purpose of error correction and transmitted from a transmitter, and for outputting received signals;

virtual decision means for extracting virtual decision data from said received signals based on a channel impulse response through which said transmission signals are transmitted;

decoding means for performing decoding processing for the purpose of error correction for said virtual decision data and for generating and outputting virtual received data;

re-coding means for performing said coding processing for said virtual received data;

a soft-decision means for outputting soft-decision data based on pseudo transmission signals, said received signals, and said channel impulse response; and switching means for providing said soft-decision data instead of said virtual decision data to said decoding means, wherein said soft-decision data are inputted at least one time into said decoding means, and final virtual received data in said virtual received data outputted from said decoding means are outputted as said received data.

4. A receiver as claimed in claim 3, wherein said virtual decision means comprises a channel impulse response estimation circuit for estimating said channel impulse response based on said received signals, and a virtual decision circuit for extracting said virtual decision data from said received signals based on said estimated channel impulse response.

5. A receiver as claimed in claim 3, wherein said soft-decision means comprises a channel impulse response updating circuit for updating said channel impulse response based on said pseudo transmission signals, and said received signals, and a soft-decision circuit for generating and outputting soft-decision data based on said updated channel impulse response, said pseudo transmission signals, and said received signals.

6. A receiver as claimed in claim 3, wherein said decoding means comprising:

a deinterleave circuit for deinterleaving said virtual decision data; and a decoding circuit for performing decoding processing for the purpose of error correction for said virtual decision data that have been deinterleaved, and said re-coding means comprising:

a re-coding circuit for performing a same coding processing performed by said transmitter for said virtual received data outputted from said decoding means, and an interleave circuit for performing same interleave processing performed by said transmitter for said re-coded virtual received data.

7. A receiver as claimed in claim 6, wherein said re-coding circuit performs convolutional coding, and said decoding circuit performs Viterbi decoding.

8. A receiver as claimed in claim 3, further comprising:

an error number detection circuit for comparing said decision data inputted to said decoding means with said re-coded data outputted from said re-coding means in order to count an error number as a number of different bits of said decision data and said re-coded data and for outputting said error number; and a loop number control circuit for controlling whether correction processing for said virtual received data is continued or halted based on said error number outputted from said error number detection circuit.

9. A receiver as claimed in claim 6, further comprising:

an error number detection circuit for comparing said data inputted to said interleave circuit with said data outputted from said deinterleave circuit in order to count an error number as a number of different bits of them and for outputting said error number; and a loop number control circuit for controlling whether correction processing for said virtual received data is continued or hated based on said error number outputted from said error number detection circuit.

10. A receiver as claimed in claim 3, wherein said receiving section comprising P (P≧1) receiving parts for receiving transmission signals corresponding to transmission data that have been processed by coding processing for the purpose of error correction and transmitted from a transmitter, and for outputting P received signals, said virtual decision means extracts virtual decision data from said P received signals based on P channel impulse response through which said transmission signals are transmitted respectively, said decoding means performs decoding processing for the purpose of error correction for said virtual decision data and for generating and outputting virtual received data, said re-coding means performs said coding processing for said virtual received data, said soft-decision means outputs soft-decision data based on pseudo transmission signals, said P received signals, and said P channel impulse response, said switching means provides said soft-decision data instead of said virtual decision data to said decoding means, and wherein said soft-decision data are inputted at least one time into said decoding means, and final virtual received data in said virtual received data outputted from said decoding means are outputted as said received data.

11. A recording medium for storing a program that is readable by a computer, and said program performing functions comprising the steps of:

extracting virtual decision data based on received signals based on a channel impulse response through which said received signals are transmitted;

performing decoding processing for the purpose of error correction for said virtual decision data, and outputting virtual received data;

performing re-cording for said virtual received data;

performing a soft-decision for pseudo transmission signals, said received signals, and said channel impulse response, and outputting soft-decision data;

performing switching processing for inputting said soft-decision data instead of said virtual decision data into said decoding processing; and performing a loop number control processing for inputting said soft-decision data at least one time and outputting final virtual received data in said virtual received data outputted from said decoding processing as said received data.

* * * * *